United States Patent
Saido et al.

(10) Patent No.: US 9,082,694 B2
(45) Date of Patent: Jul. 14, 2015

(54) SUBSTRATE PROCESSING APPARATUS, METHOD FOR MANUFACTURING SUBSTRATE, AND METHOD FOR MANUFACTURING SEMICONDUCTOR DEVICE

(75) Inventors: Shuhei Saido, Toyama (JP); Daisuke Hara, Toyama (JP); Takafumi Sasaki, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 68 days.

(21) Appl. No.: 14/001,510
(22) PCT Filed: Feb. 22, 2012
(86) PCT No.: PCT/JP2012/054325
§ 371 (c)(1),
(2), (4) Date: Sep. 2, 2013
(87) PCT Pub. No.: WO2012/115170
PCT Pub. Date: Aug. 30, 2012

(65) Prior Publication Data
US 2013/0330930 A1    Dec. 12, 2013

(30) Foreign Application Priority Data
Feb. 24, 2011 (JP) ................. 2011-038813

(51) Int. Cl.
*C23C 16/00* (2006.01)
*H01L 21/205* (2006.01)
(Continued)

(52) U.S. Cl.
CPC .......... *H01L 21/205* (2013.01); *C23C 16/4557* (2013.01); *C23C 16/45578* (2013.01);
(Continued)

(58) Field of Classification Search
CPC .............. H01L 21/67303; C23C 16/46; C23C 16/45578; C23C 16/4557; C23C 16/4583; C23C 16/54

USPC ................... 118/725, 715; 438/758
See application file for complete search history.

(56) References Cited

U.S. PATENT DOCUMENTS 8,070,880 B2 * 12/2011 Marubayashi et al. ........ 118/719
8,895,457 B2 * 11/2014 Akae et al. ................. 438/791
(Continued)

FOREIGN PATENT DOCUMENTS

JP     H09-260299 A     10/1997
JP     2008-504443 A    2/2008
(Continued)

OTHER PUBLICATIONS

International Search Report issued in International Application No. PCT/JP2012/054325 on Mar. 19, 2012.
(Continued)

*Primary Examiner* — Bac Au
(74) *Attorney, Agent, or Firm* — Solaris Intellectual Property Group, PLLC

(57) ABSTRACT

A substrate processing apparatus includes: a processing chamber that accommodates a substrate; a heating portion that is provided so as to surround a accommodating region of the substrate within the processing chamber; a gas nozzle that is provided inside the heating portion and that supplies a processing gas to the accommodating region of the substrate; and a gas heating mechanism that is provided inside the heating portion and that supplies the processing gas from an upstream side of the gas nozzle into the gas nozzle. A ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle.

16 Claims, 19 Drawing Sheets

(51) Int. Cl.
 *C23C 16/455* (2006.01)
 *C23C 16/46* (2006.01)
 *H01L 21/67* (2006.01)
 *H01L 21/02* (2006.01)

(52) U.S. Cl.
 CPC ............ *C23C16/46* (2013.01); *H01L 21/0262* (2013.01); *H01L 21/02381* (2013.01); *H01L 21/02532* (2013.01); *H01L 21/67109* (2013.01)

(56) References Cited

U.S. PATENT DOCUMENTS

| | | | |
|---|---|---|---|
| 2008/0145533 A1* | 6/2008 | Honda et al. | 427/248.1 |
| 2008/0173238 A1* | 7/2008 | Nakashima et al. | 118/723 R |
| 2010/0282166 A1* | 11/2010 | Fukuda et al. | 118/722 |
| 2010/0297832 A1* | 11/2010 | Imai et al. | 438/478 |
| 2011/0303152 A1* | 12/2011 | Asari et al. | 118/725 |
| 2013/0122692 A1 | 5/2013 | Imai et al. | |

FOREIGN PATENT DOCUMENTS

| | | |
|---|---|---|
| JP | 2009-149948 A | 7/2009 |
| JP | 2009-191283 A | 8/2009 |
| JP | 2010-093067 | 4/2010 |
| JP | 2010-283270 A | 12/2010 |
| JP | 2011-003885 A | 1/2011 |

OTHER PUBLICATIONS

Office action dated Sep. 2, 2014 from the Japanese Patent Office in a Japanese patent application corresponding to the instant patent application.

* cited by examiner

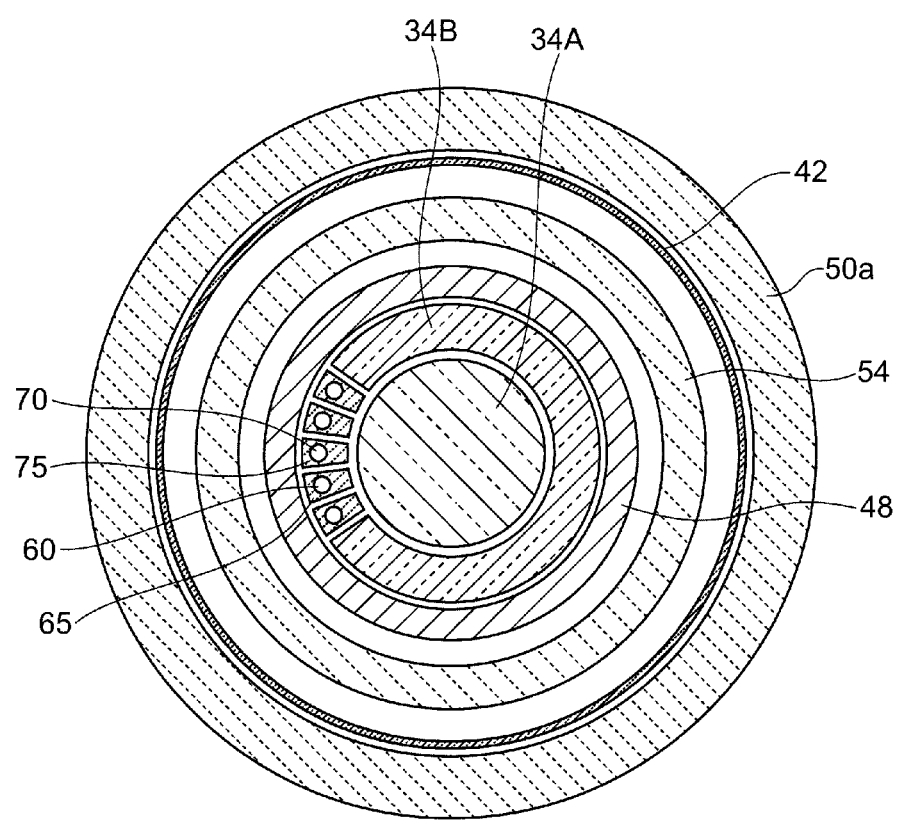

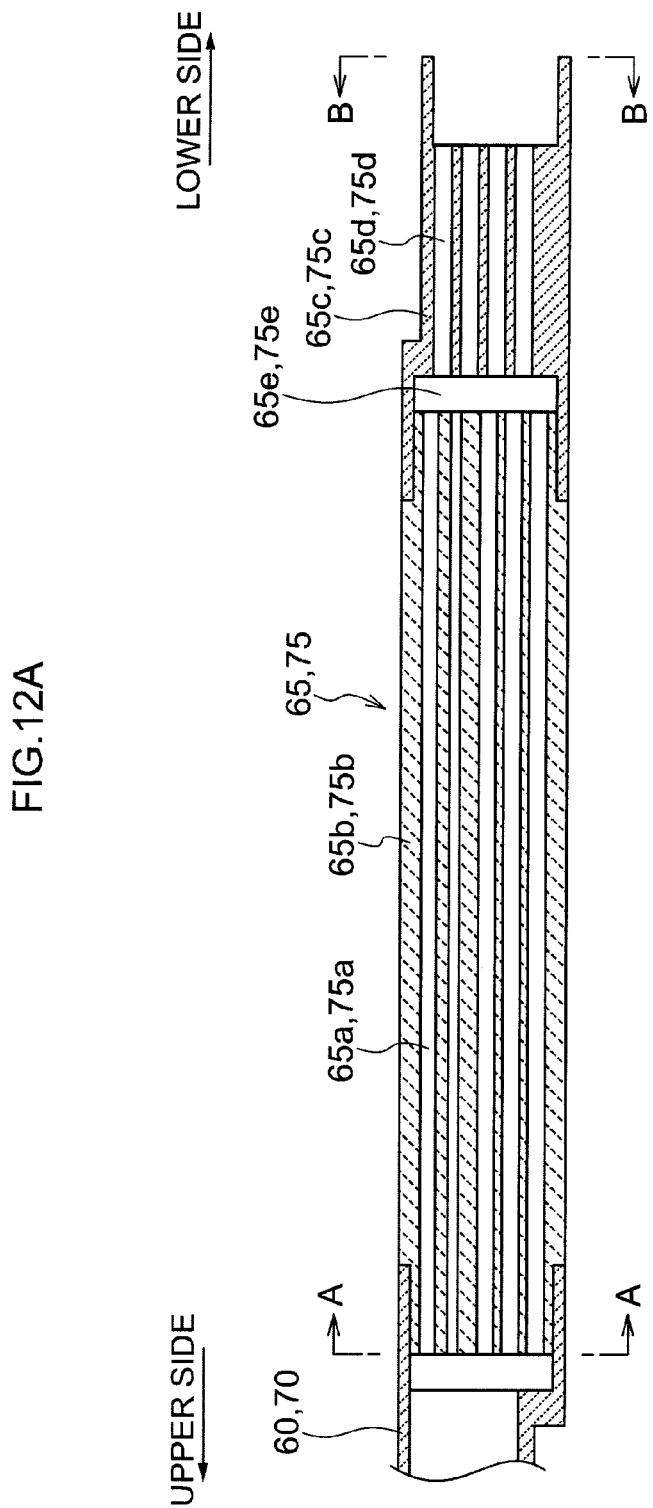

SUBSTRATE PROCESSING APPARATUS, METHOD FOR MANUFACTURING SUBSTRATE, AND METHOD FOR MANUFACTURING SEMICONDUCTOR DEVICE

FIELD OF THE INVENTION

The present invention relates to a substrate processing apparatus in which processing gas is supplied to a substrate to process the substrate, a method for manufacturing a substrate, and a method for manufacturing a semiconductor device.

DESCRIPTION OF THE RELATED ART

As an element material for a power device, a silicon carbide (SiC) substrate and the like having a silicon carbide (SiC) film formed on the surface thereof has been in the spotlight. The SiC film can be formed by raising the temperature of the inside of a processing chamber, into which a substrate is loaded, to 1500° C. to 1800° C. through induction heating or the like, and supplying a processing gas including a silicon (Si) element and a processing gas including a carbon (C) element into the processing chamber.

Most of apparatuses which are supplied to the market as substrate processing apparatuses for mass production that form a SiC film are so-called "pancake type" or "planetary type" apparatuses that process several to several tens of substrates simultaneously in a state where these substrates are lined up two-dimensionally on a heated susceptor. However, in such a plane-type apparatus, there is a problem in that it is difficult to control the concentration distribution of a processing gas supplied to a substrate, or an increase in the diameter of a substrate causes an increase in production costs. In order to solve such a problem, a vertical substrate processing apparatus has been recently proposed in which plural substrates are laminated in a longitudinal direction and are processed simultaneously (see, for example, Japanese Patent Application Laid-Open (JP-A) No. 2011-003885).

Meanwhile, in the substrate processing apparatus that forms a SiC film, a processing gas supplied to a substrate is required to be heated to a high temperature in advance, in order to raise the temperature of the substrate to 1500° C. to 1800° C. As an apparatus that heats a processing gas supplied into a processing chamber in advance, a preheating apparatus including a heating plate having a large heat capacity therein is known (see, for example, JP-A No. 2010-283270).

DISCLOSURE OF INVENTION

However, it is assumed that the preheating apparatus of the related art is provided outside a processing chamber, and the supply of a heated gas into the processing chamber is required to be performed using a gas supply pipe that connects the preheating device and the processing chamber. In such a configuration, it is difficult to heat the processing gas in excess of the heat resistant temperature of the gas supply pipe. In addition, since the preheating apparatus and the processing chamber are installed separately from each other, the temperature of the processing gas may drop before the processing gas reaches the processing chamber, and thus it is difficult to efficiently supply the heated gas to a substrate.

An object of the present invention is to provide a substrate processing apparatus, a method for manufacturing a substrate, and a method for manufacturing a semiconductor device which are capable of efficiently heating a processing gas supplied to a accommodating region of a substrate.

According to an aspect of the present invention, there is provided a substrate processing apparatus including:
a processing chamber that accommodates a substrate;
a heating portion that is provided so as to surround a accommodating region of the substrate within the processing chamber;
a gas nozzle that is provided inside the heating portion and that supplies a processing gas to the accommodating region of the substrate; and
a gas heating mechanism that is provided inside the heating portion and that supplies the processing gas from an upstream side of the gas nozzle into the gas nozzle, wherein
a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle.

According to another aspect of the present invention, there is provided a method for manufacturing a substrate, including:
a step of accommodating a substrate within a processing chamber;
a step of starting heating by a heating portion provided so as to surround a accommodating region of the substrate within the processing chamber, and raising a temperature of the substrate to a predetermined temperature;
a step of supplying heated processing gas from a gas heating mechanism through a gas nozzle into the processing chamber and processing the substrate, the gas heating mechanism being provided inside the heating portion and supplying a processing gas from an upstream side of the gas nozzle that supplies the processing gas to the accommodating region of the substrate into the gas nozzle, and being configured such that a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle; and
a step of unloading the substrate after the processing from the inside of the processing chamber.

According to still another aspect of the present invention, there is provided a method for manufacturing a semiconductor device, including:
a step of accommodating a substrate within a processing chamber;
a step of starting heating by a heating portion provided so as to surround a accommodating region of the substrate within the processing chamber, and raising a temperature of the substrate to a predetermined temperature;
a step of supplying heated processing gas from a gas heating mechanism through a gas nozzle into the processing chamber and processing the substrate, the gas heating mechanism being provided inside the heating portion and supplying a processing gas from an upstream side of the gas nozzle that supplies the processing gas to the accommodating region of the substrate into the gas nozzle, and being configured such that a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle; and
a step of unloading the substrate after the processing from the inside of the processing chamber.

BRIEF DESCRIPTION OF DRAWINGS

FIG. 10 is a transverse cross-sectional view of a treatment furnace according to a third embodiment of the present invention.

FIG. 12A is a longitudinal cross-sectional view of a first gas heating mechanism and a second gas heating mechanism according to a fourth embodiment of the present invention.

DESCRIPTION OF EMBODIMENTS

First Embodiment of the Present Invention

Hereinafter, a first embodiment of the present invention will be described with reference to the accompanying drawings.

(1) Configuration of Substrate Processing Apparatus

Figure 1:
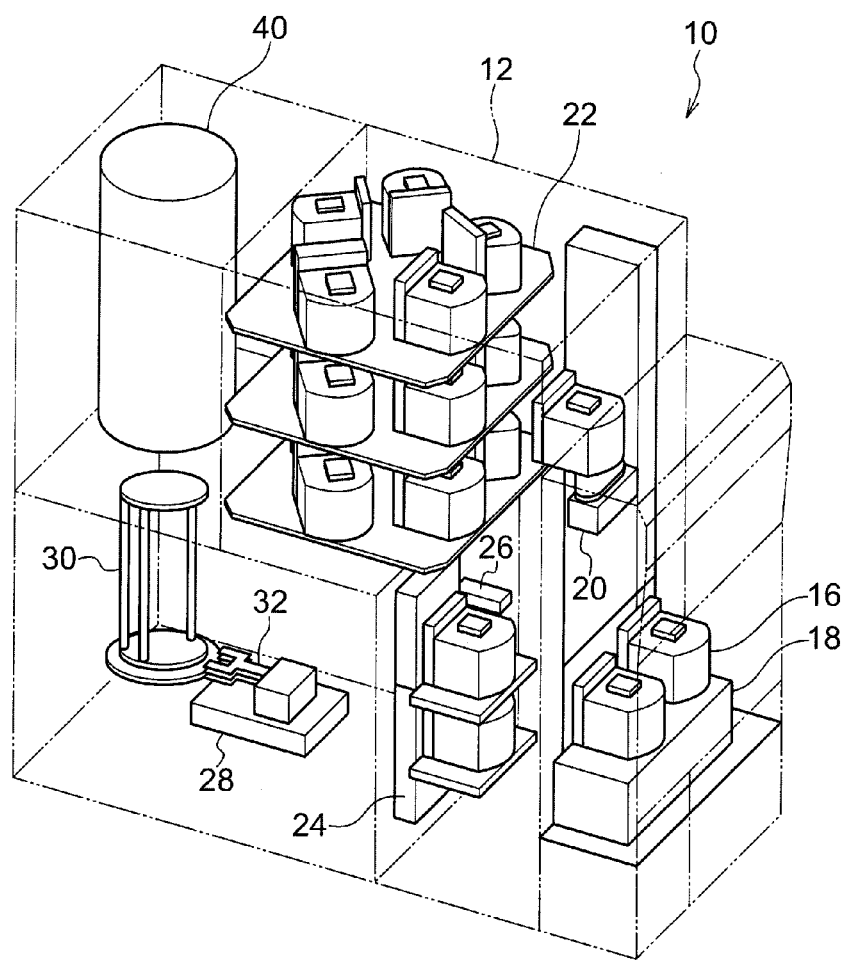
FIG. 1 is a perspective view of a semiconductor manufacturing apparatus according to a first embodiment of the present invention.
Figure 2A:
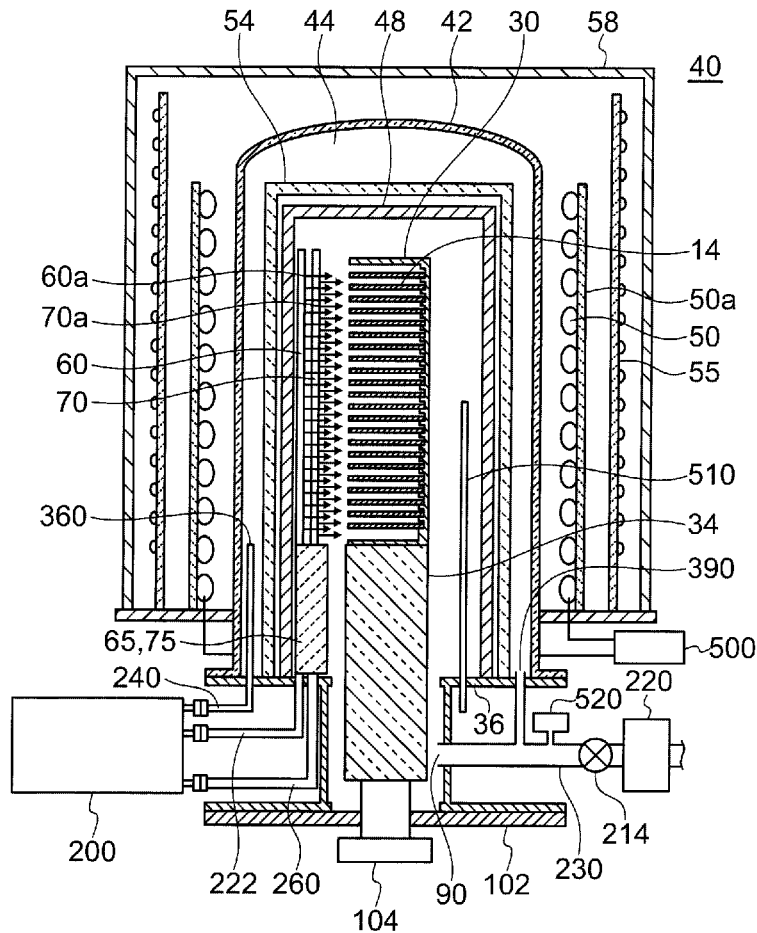
FIG. 2A is a longitudinal cross-sectional view of a treatment furnace according to the first embodiment of the present invention.
Figure 2B:
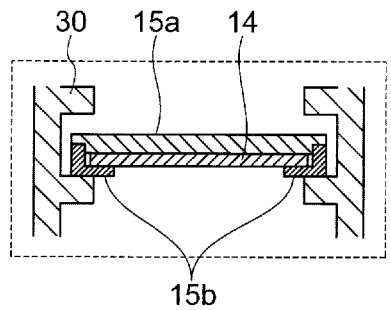
FIG. 2B is a partially enlarged view of FIG. 2A.
Figure 3:
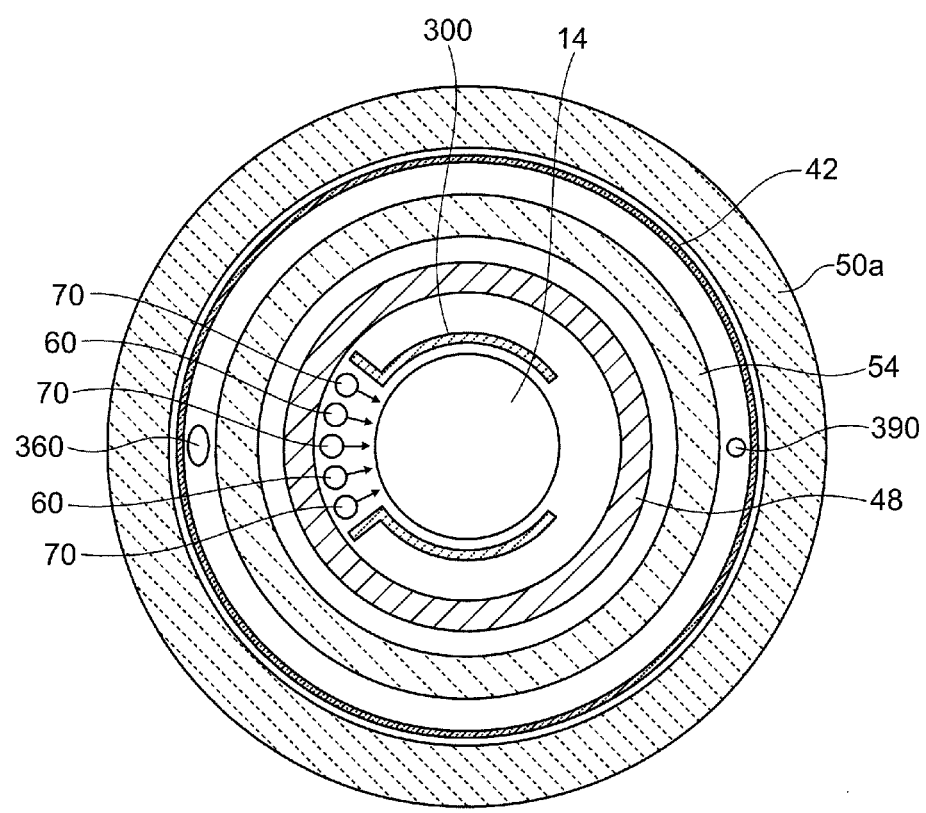
FIG. 3 is a transverse cross-sectional view of the treatment furnace according to the first embodiment of the present invention.
Figure 4A:
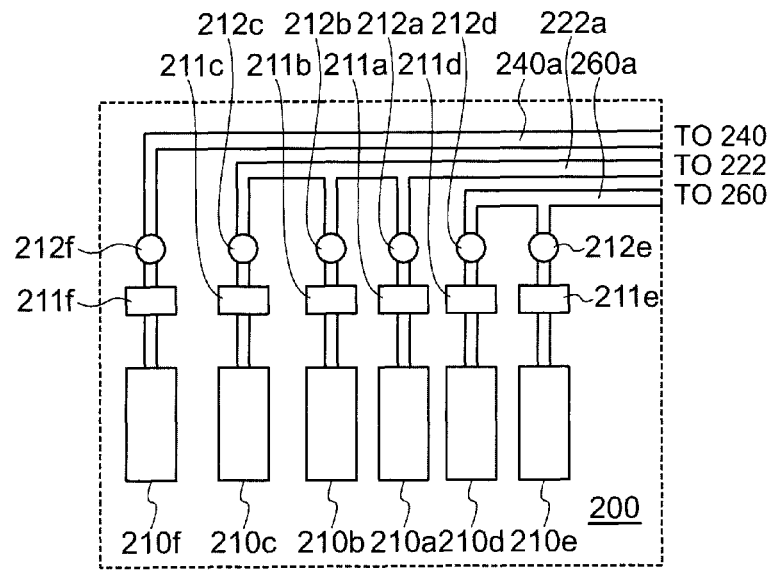
FIG. 4A is a configuration diagram of a gas supply unit of the semiconductor manufacturing apparatus according to the first embodiment of the present invention, and shows a case where the gas supply unit is formed in a separate mode.
Figure 4B:
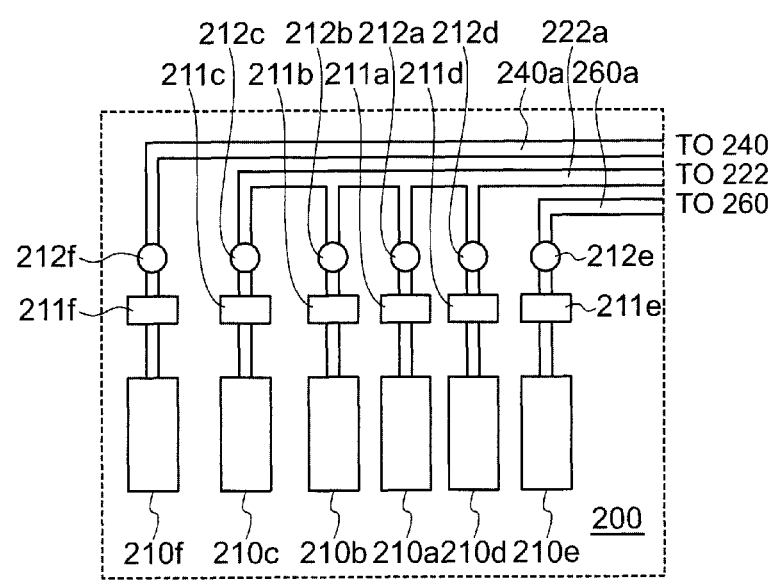
FIG. 4B is a configuration diagram of a gas supply unit of the semiconductor manufacturing apparatus according to the first embodiment of the present invention, and shows a case where the gas supply unit is formed in a premixed mode.
Figure 5:
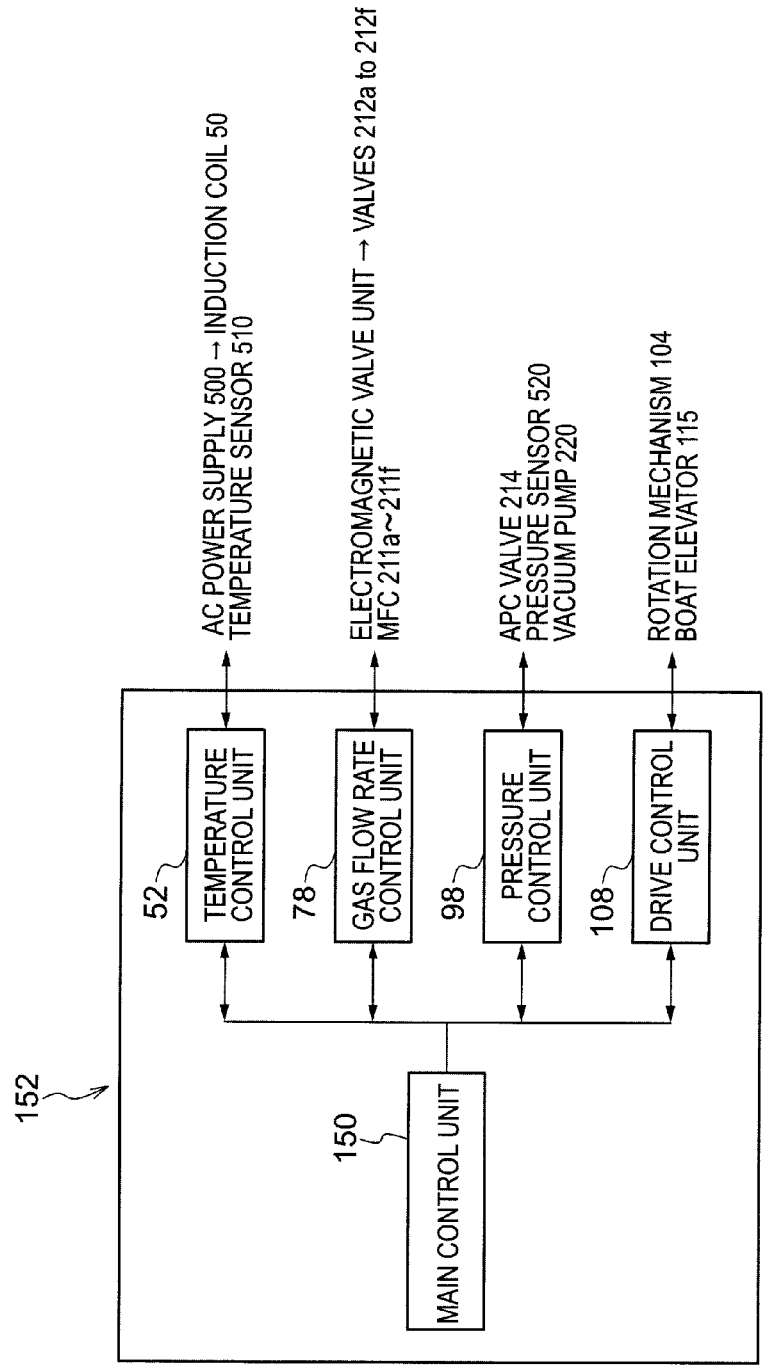
FIG. 5 is a block diagram illustrating a control configuration of the semiconductor manufacturing apparatus according to the first embodiment of the present invention.
Figure 6:
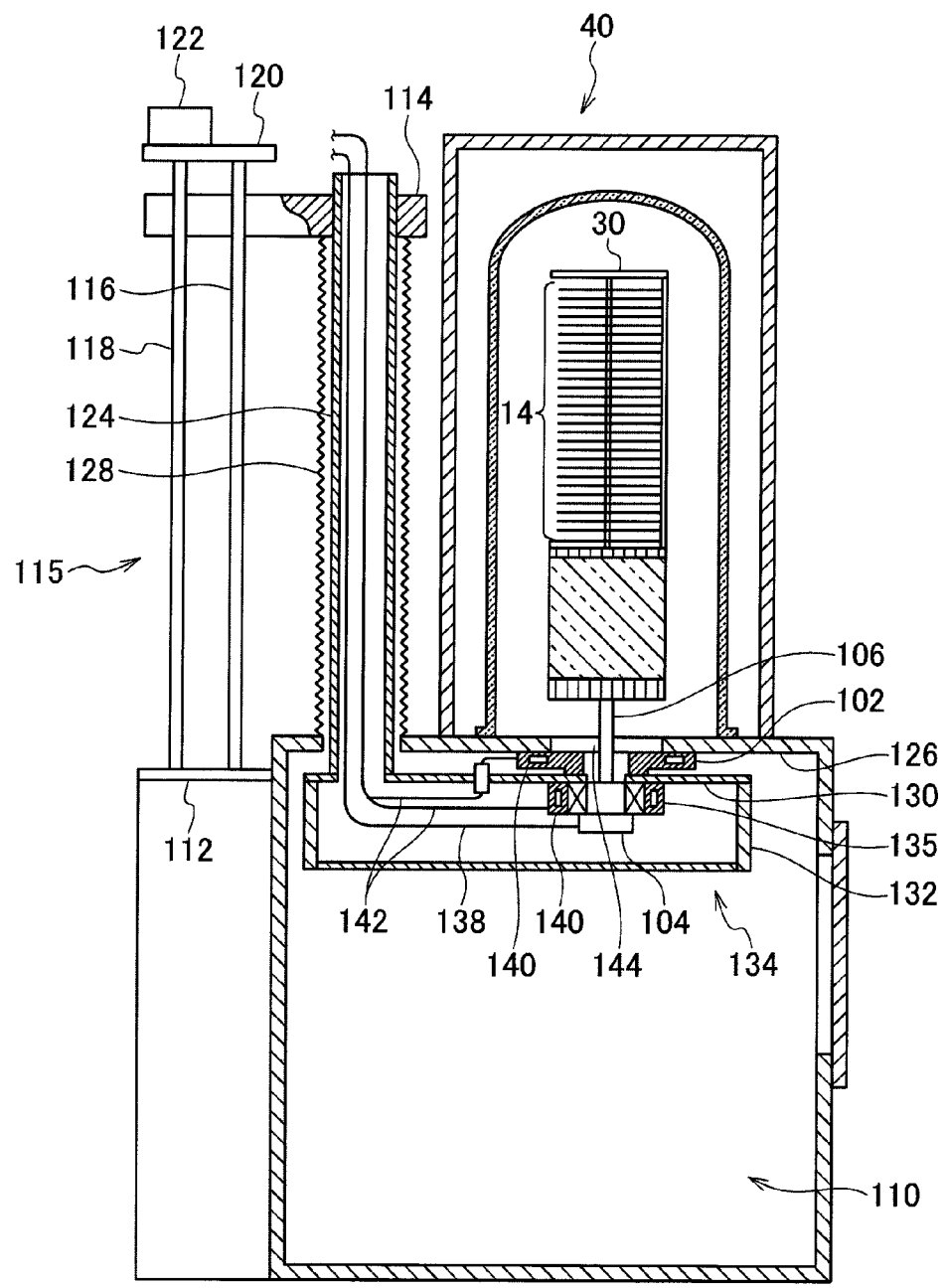
FIG. 6 is a longitudinal cross-sectional view of the treatment furnace and its periphery of the semiconductor manufacturing apparatus according to the first embodiment of the present invention.
Figure 7A:
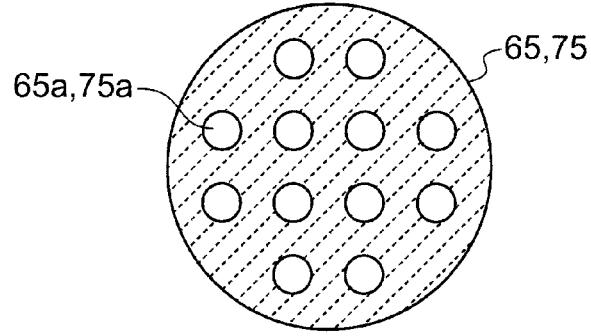
FIG. 7A is a transverse cross-sectional view of the first gas heating mechanism and the second gas heating mechanism according to the first embodiment of the present invention.
Figure 7B:
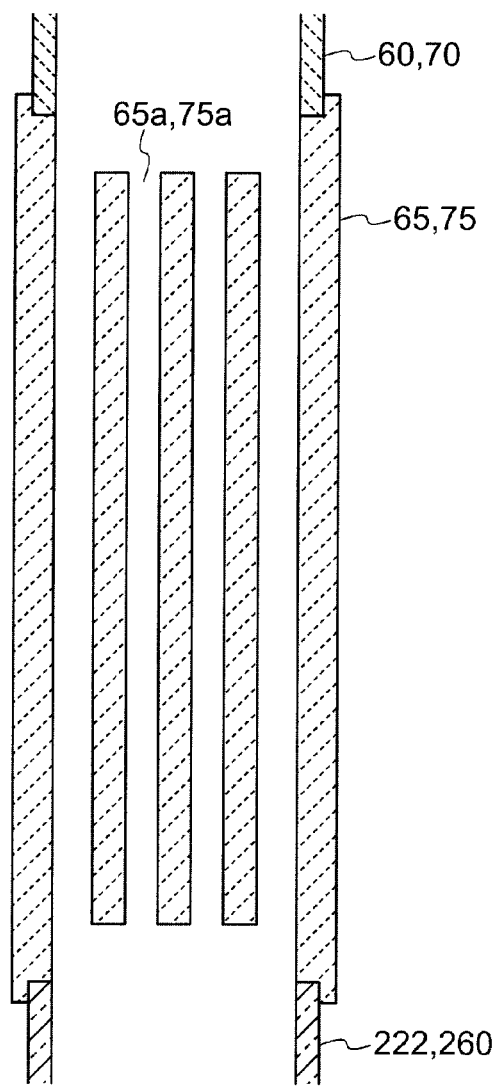
FIG. 7B is a longitudinal cross-sectional view of a first gas heating mechanism and a second gas heating mechanism according to the first embodiment of the present invention.
Figure 7C:
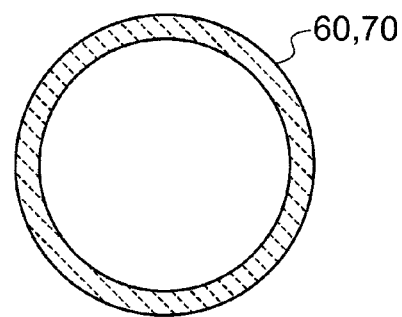
FIG. 7C is a transverse cross-sectional view of a first gas nozzle a and second gas nozzle according to the first embodiment of the present invention.
Figure 7D:
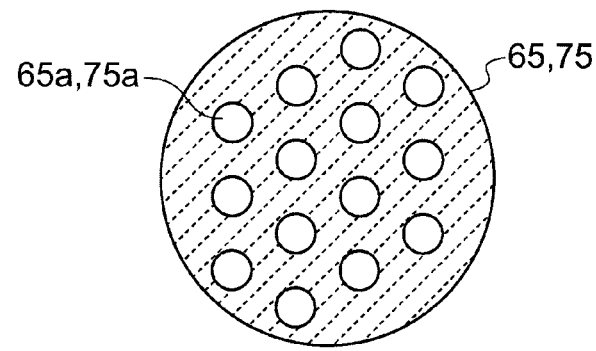
FIG. 7D is a transverse cross-sectional view illustrating a modified example of the first gas heating mechanism and the second gas heating mechanism according to the first embodiment of the present invention.

First, the configuration of a semiconductor manufacturing apparatus 10 used as a substrate processing apparatus according to the present embodiment will be described with reference to FIGS. 1 to 7. FIG. 1 is a perspective view of the semiconductor manufacturing apparatus 10 according to the present embodiment. FIG. 2A is a longitudinal cross-sectional view of a treatment furnace 40 according to the present embodiment, and FIG. 2B is a partially enlarged view of an essential part of FIG. 2A. FIG. 3 is a transverse cross-sectional view of the treatment furnace 40 according to the present embodiment. FIGS. 4A and 4B are diagrams illustrating a gas supply unit 200 of the semiconductor manufacturing apparatus 10 according to the present embodiment. FIG. 4A shows a case where the gas supply unit is formed in a separate mode, and FIG. 4B shows a case where the gas supply unit is formed in a premixed mode. FIG. 5 is a block diagram illustrating a control configuration of the semiconductor manufacturing apparatus 10 according to the present embodiment. FIG. 6 is a longitudinal cross-sectional view of the treatment furnace 40 and its periphery of the semiconductor manufacturing apparatus 10 according to the present embodiment. FIG. 7A is a transverse cross-sectional view of gas heating mechanisms 65 and 75 according to the present embodiment, FIG. 7B is a longitudinal cross-sectional view of the gas heating mechanisms, and FIG. 7C is a transverse cross-sectional view of gas nozzles 60 and 70. FIG. 7D is a transverse cross-sectional view illustrating a modified example of the first gas heating mechanism and the second gas heating mechanism according to the present embodiment.

Meanwhile, the semiconductor manufacturing apparatus 10 according to the present embodiment is configured as an apparatus that epitaxially grows SiC films on plural substrates lined up in a longitudinal direction, or a so-called batch-type vertical SiC epitaxial growth system. The apparatus is configured as a batch-type vertical SiC epitaxial growth system, and thus it is possible to process many substrates at a time, and to improve productivity.

(Entire Configuration)

The semiconductor manufacturing apparatus 10 includes a housing 12 provided therein with main portions such as the treatment furnace 40. As a container (wafer carrier) for transporting a substrate into the housing 12, a pod 16 is used. The pod 16 is configured so that, for example, twenty-five wafers 14 used as a substrate made of SiC or the like are accommodated therein. A pod stage 18 is disposed at the front side of the housing 12. The pod 16 is configured to be placed on the pod stage 18 in a state where a cover is closed. A pod transport apparatus 20 is disposed at the front of the inside of the housing 12 and a position facing the pod stage 18. Pod storage racks 22, a pod opener 24 and a substrate number detector 26 are disposed in the vicinity of the pod transport apparatus 20. The pod storage rack 22 is configured to be disposed above the pod opener 24, and be held in a state where plural pods 16 are placed thereon. The substrate number detector 26 is disposed adjacent to the pod opener 24. The pod transport apparatus 20 is configured to transport the pod 16 between the pod stage 18, the pod storage rack 22, and the pod opener 24. The pod opener 24 is configured to open the cover of the pod 16. The substrate number detector 26 is configured to detect the number of wafers 14 within the pod 16 of which the cover is opened.

A substrate transfer machine 28 and a boat 30 used as a substrate holding body are disposed within the housing 12. The substrate transfer machine 28 has an arm (tweezer) 32, and is configured to be capable of being elevated and rotated by driving means which is not shown. The arm 32 is configured to be capable of extracting, for example, five wafers 14 simultaneously. By moving the arm 32, the wafer 14 is transported between the pod 16 placed at a position of the pod opener 24 and the boat 30.

The boat 30 used as a substrate holding body is formed of a heat resistant material such as, for example, carbon graphite or SiC. The boat 30 is configured so that the plural wafers 14 are lined up in a horizontal posture and in a state where the centers thereof are aligned with each other, and are stacked up and held in a longitudinal direction. Meanwhile, a boat thermal insulating portion 34 used as a hollow cylindrical thermal insulating portion formed of a heat resistant material such as, for example, quartz or SiC is disposed below the boat 30. The boat thermal insulating portion 34 is configured to support the boat 30 from below, and prevent heat from an induced body 48 described later from being transferred to the lower side of the treatment furnace 40 (see FIG. 2A).

The treatment furnace 40 is disposed above the rear side within the housing 12. The boat 30 loaded with plural wafers 14 is loaded into the treatment furnace 40, and heat treatment is performed therein.

(Configuration of Treatment Furnace)

Next, the configuration of the treatment furnace 40 included in the semiconductor manufacturing apparatus 10 will be described with reference to FIGS. 2A to 4B.

As shown in FIG. 2A, the treatment furnace 40 includes a reaction tube 42 which is formed of a heat resistant material such as quartz or SiC, and is formed in a cylindrical shape having a blocked upper end and an opened lower end. A reaction chamber 44 used as a processing chamber is formed in the cylindrical hollow portion of the reaction tube 42. The reaction chamber 44 is configured so that the above-mentioned boat 30 in which the wafer 14 used as a substrate made of SiC or the like is held is accommodated therein. Meanwhile, the wafer 14 is held by the boat 30 so that the film formation surface thereof serves as a lower surface. At this time, as shown in FIG. 2B, the wafer 14 may be held by an annular lower wafer holder 15b from below, and may be held by the boat 30 in a state where the upper surface (surface on the opposite side to the film formation surface) thereof is covered by a discoid upper wafer holder 15a. Thereby, it is possible to suppress the adhesion of particles to the upper surface of the wafer 14 or the formation of a film thereon. In addition, it is possible to separate the film formation surface from a support groove of a boat column by the height of the lower wafer holder 15b, and to reduce the influence of the boat column on a film formation process.

A manifold 36 is provided below the reaction tube 42 concentrically with the reaction tube 42. The manifold 36 is made of, for example, a stainless steel or the like, and is formed in a cylindrical shape having opened upper and lower ends. The manifold 36 is provided so as to support the reaction tube 42 from below. An O-ring (not shown) used as a seal member is provided between the manifold 36 and the reaction tube 42. The manifold 36 is supported by a holding body which is not shown, and thus the reaction tube 42 is installed vertically. A reaction container is formed by the reaction tube 42 and the manifold 36.

The treatment furnace 40 includes the induced body 48 used as an object to be heated by induction heating, and an induction coil 50 used as an induction heating portion (magnetic field generation portion). The induced body 48 is formed of a conductive heat resistant material such as, for example, carbon, and is provided so as to surround the boat 30 accommodated within the reaction chamber 44, that is, surround a accommodating region of the wafer 14. The induced body 48 is formed in a cylindrical shape having a blocked upper end and an opened lower end. The induction coil 50 is supported by a coil support 50a formed of an insulating heat resistant material, and is provided so as to surround the outer circumference of the reaction tube 42. The induction coil 50 is supplied with an AC power of, for example, 10 to 200 kW at 10 to 100 kHz from an AC power supply 500. An induction current (eddy current) flows in the induced body 48 due to an AC magnetic field generated by passing an alternating current through the induction coil 50, and thus the induced body 48 generates heat due to Joule heat. The induced body 48 generates heat, and thus the wafer 14 held by the boat 30 or the inside of the reaction chamber 44 is heated to a predetermined film formation temperature, for example, a temperature of 1500° C. to 1800° C., due to radiant heat emanating from the induced body 48. Meanwhile, in order to prevent thermal damage, the temperature of constituent members located below the treatment furnace 40 is preferably maintained at a temperature of, for example, 200° C. or lower.

As a temperature detection body that detects the temperature of the inside of the reaction chamber 44, a temperature sensor 510 is provided in the vicinity of the induced body 48. The AC power supply 500 and the temperature sensor 510 are electrically connected to a temperature control unit 52 (see FIG. 5) described later. The temperature control unit 52 perform control so that the temperature of the inside of the reaction chamber 44 has a desired temperature distribution by regulating the state of electrical conduction from the AC power supply 500 to the induction coil 50 on the basis of temperature information detected by the temperature sensor 510.

The heating portion according to the present embodiment is mainly constituted by the induced body 48, the induction coil 50, the AC power supply 500, and the temperature sensor 510.

Meanwhile, a thermal insulating body 54 formed of, for example, a carbon felt or the like which is not likely to be induced is provided between the reaction tube 42 and the induced body 48. The thermal insulating body 54 is formed in a cylindrical shape having a block upper end and an opened lower end. The thermal insulating body 54 is provided, and thus it is possible to suppress the transfer of heat of the induced body 48 to the reaction tube 42 or the outside of the reaction tube 42.

In addition, an outer thermal insulation wall 55 having, for example, a cooling structure which suppresses the transfer of the heat within the reaction chamber 44 to the outside is provided outside the induction coil 50 so as to surround the reaction chamber 44. Further, a magnetic seal 58 that prevents a magnetic field generated by the induction coil 50 from leaking to the outside is provided outside the outer thermal insulation wall 55.

The treatment furnace 40 is provided with the first gas nozzle 60 having a first gas supply port 60a, the second gas nozzle 70 having a second gas supply port 70a, and the like.

The first gas nozzle 60 is located at the inside of the induced body 48, and is provided in a vertical direction between the accommodating region of the wafer 14 and the induced body 48. The first gas nozzle 60 is formed of a heat resistant material such as, for example, carbon graphite. The first gas nozzle 60 is provided with at least one first gas supply port 60a. Plural first gas supply ports 60a may be provided for each wafer 14 from the lower portion of the reaction chamber 44 to the upper portion thereof. The upstream end of the first gas nozzle 60 is connected to the downstream end of the first gas heating mechanism 65. The downstream end of a first gas supply pipe 222 is connected to the upstream side of the first gas heating mechanism 65. The first gas supply pipe 222 is provided so as to pass through the manifold 36. The gas supply unit 200 is connected to the upstream end of the first gas supply pipe 222.

The second gas nozzle 70 is located at the inside of the induced body 48, and is provided in a vertical direction between the accommodating region of the wafer 14 and the induced body 48. The second gas nozzle 70 is formed of a heat resistant material such as, for example, carbon graphite. The second gas nozzle 70 is provided with at least one second gas supply port 70a. Plural second gas supply ports 70a may be provided for each wafer 14 from the lower portion of the reaction chamber 44 to the upper portion thereof. The upstream end of the second gas nozzle 70 is connected to the downstream end of the second gas heating mechanism 75. The downstream end of a second gas supply pipe 260 is connected to the upstream side of the second gas heating mechanism 75. The second gas supply pipe 260 is provided so as to pass through the manifold 36. The gas supply unit 200 is connected to the upstream end of the second gas supply pipe 260.

A third gas supply pipe 240 is provided in a vertical direction at the outside of the induced body 48 and between the thermal insulating body 54 and the reaction tube 42. A third gas supply port 360 is provided at the downstream end of the third gas supply pipe 240. The third gas supply pipe 240 is provided so as to pass through the manifold 36. The gas supply unit 200 is connected to the upstream end of the third gas supply pipe 240.

A gas flow channel for heating a processing gas supplied from the first gas supply pipe 222 to supply the heated gas into the first gas nozzle 60 is formed within the first gas heating mechanism 65. Similarly, a gas flow channel for heating a processing gas supplied from the second gas supply pipe 260 to supply the heated gas into the second gas nozzle 70 is formed within the second gas heating mechanism 75. The configurations of the first gas heating mechanism 65, the second gas heating mechanism 75, and the gas supply unit 200 will be described later.

Meanwhile, the first gas nozzle 60 and the second gas nozzle 70 may be provided one by one, but may be provided in plural. At this time, it is preferable that the first gas nozzle 60 and the second gas nozzle 70 be disposed alternately. For example, when three second gas nozzles 70 are provided and two first gas nozzles 60 are provided, as shown in FIG. 3, it is preferable that these gas nozzles be disposed alternately so that the first gas nozzle 60 is interposed between the second gas nozzles 70. These gas nozzles are disposed in this manner, and thus when different types of processing gases are supplied from the first gas nozzle 60 and the second gas nozzle 70, it is possible to stimulate the mixing of processing gases within the reaction chamber 44. In addition, for example, the number of second gas nozzles 70 is set to an odd number, the number of first gas nozzles 60 is set to an even number, and these gas nozzles are disposed alternately. Thus, it is possible to supply a processing gas from the second gas nozzle 70 disposed at the center in a horizontal symmetry, and to improve the wafer in-plane uniformity of substrate processing. Meanwhile, gaseous species supplied from the first gas nozzle 60 and the second gas nozzle 70 will be described later.

In addition, as shown in FIG. 3, structures 300 that extend in a vertical direction and have an arc-shaped cross section are preferably provided between the first gas nozzle 60 and the second gas nozzle 70, and a first exhaust port 90 described later, and between the wafer 14 and the induced body 48 so as to bury a space therebetween. Meanwhile, the structures 300 are preferably provided so as to face each other with the wafer 14 interposed therebetween. With such a configuration, it is possible to prevent the gases supplied from the first gas nozzle 60 and the second gas nozzle 70 from flowing along the inner wall of the induced body 48 and bypassing the wafer 14. The structure 300 secures heat resistance and suppresses the generation of particles. Therefore, the structure is preferably formed of a heat insulating material such as carbon graphite or SiC.

The first exhaust port 90 is set up at the lateral side of the boat thermal insulating portion 34 (lower side of the accommodating region of the wafer 14) and the sidewall of the manifold 36 facing the first gas supply port 60a or the second gas supply port 70a. In addition, a second exhaust port 390 is set up between the thermal insulating body 54 and the reaction tube 42 and at the configuration wall of the manifold 36 facing the third gas supply port 360. The upstream ends branched from an exhaust pipe 230 are connected to the first exhaust port 90 and the second exhaust port 390, respectively. The exhaust pipe 230 is provided with a pressure sensor 520 used as a pressure detector, an APC (Auto Pressure Controller) valve 214 used as an pressure regulator, and a vacuum pump 220 used as a vacuum exhaust device, in order from the upstream side. The pressure sensor 520, the APC valve 214, and the vacuum pump 220 are electrically connected to a pressure control unit 98 (see FIG. 5) described later. The pressure control unit 98 performs control so that the pressure of the inside of the reaction chamber 44 is equal to a predetermined pressure at a predetermined timing by performing feedback control on the degree of opening of the APC valve 214 on the basis of pressure information measured in the pressure sensor 520.

By providing the first exhaust port 90 as stated above, a gas supplied from the first gas supply port 60a and the second gas supply port 70a into the reaction chamber 44 flows parallel to the surface of the wafer 14, and then flows downward toward the inside of reaction chamber 44 (inside of the induced body 48) through regions provided with the first gas heating mechanism 65, the second gas heating mechanism 75, and the boat thermal insulating portion 34, and is exhausted from the first exhaust port 90. At this time, the entirety of the wafer 14 is exposed to the gas efficiently and uniformly. Meanwhile, as described later, the first gas heating mechanism 65 and the second gas heating mechanism 75 are heated by being exposed to a high-temperature exhaust gas (heated processing gas).

In addition, by providing the second exhaust port 390 as stated above, a gas supplied from the third gas supply port 360 into the reaction chamber 44 acts as a purge gas, flows between the reaction tube 42 and the thermal insulating body 54, and is exhausted from the second exhaust port 390. Thereby, it is possible to suppress to the infiltration of a processing gas to between the reaction tube 42 and the thermal insulating body 54, and to prevent unnecessary products or the like from being attached to the surfaces thereof.

(Configuration of Gas Supply Unit)

Next, the configuration of the above-mentioned gas supply unit 200 will be described with reference to FIGS. 4A and 4B.

FIGS. 4A and 4B are configuration diagrams of the gas supply unit 200 according to the present embodiment. FIG. 4A shows a case where the gas supply unit is formed in a separate mode for supplying a silicon-containing gas and a carbon-containing gas from different gas nozzles, and FIG. 4B shows a case where the gas supply unit is formed in a premixed mode for supplying a silicon-containing gas and a carbon-containing gas from the same gas nozzle.

First, the gas supply unit 200 formed in a separate mode will be described with reference to FIG. 4A.

The gas supply unit 200 includes a first-unit pipe 222a, a second-unit pipe 260a, and a third-unit pipe 240a. The downstream ends of the first-unit pipe 222a, the second-unit pipe 260a, and the third-unit pipe 240a are connected to the upstream ends of the first gas supply pipe 222, the second gas supply pipe 260, and the third gas supply pipe 240, respectively.

The upstream side of the first-unit pipe 222a is branched into three parts. The upstream ends branched from the first-unit pipe 222a are respectively connected to a $SiH_4$ gas supply source 210a that supplies, for example, a silane ($SiH_4$) gas used as a silicon (Si)-containing gas, a HCl gas supply source 210b that supplies a hydrogen chloride (HCl) gas used as a chlorine (Cl)-containing gas (etching gas), and an Ar gas supply source 210c that supplies, for example, an argon (Ar) gas which is an inert gas used as a carrier gas or purge gas, through valves 212a, 212b, and 212c and mass flow controllers (hereinafter, referred to as MFCs) 211a, 211b, and 211c used as a flow rate controller (flow rate control means).

The upstream end of the second-unit pipe 260a is branched into two parts. The upstream ends branched from the second-unit pipe 260a are respectively connected to a $C_3H_8$ gas supply source 210d that supplies, for example, a propane ($C_3H_8$) gas used as a carbon (C)-containing gas and a $H_2$ gas supply source 210e that supplies, for example, a hydrogen ($H_2$) gas used as a hydrogen (H)-containing gas (reducing gas), through valves 212d and 212e and mass flow controllers (hereinafter, referred to as MFCs) 211d and 211e used as a flow rate controller (flow rate control means).

The upstream end of the third-unit pipe 240a is connected to an Ar gas supply source 210f that supplies, for example, an argon (Ar) gas which is an inert gas used as a purge gas, through a valve 212f and a mass flow controller (hereinafter, referred to as MFC) 211f used as a flow rate controller (flow rate control means).

The valves 212a, 212b, 212c, 212d, and 212f are electrically connected to a gas flow rate control unit 78 (see FIG. 5), described later, through an electromagnetic valve unit (not shown), and the MFCs 211a, 211b, 211c, 211d, 211e, and 211f are electrically connected to the gas flow rate control unit 78 (see FIG. 5) described later. The gas flow rate control unit 78 controls the supply flow rates, the concentrations, the partial pressures, and the supply timings of a $SiH_4$ gas, a $C_3H_8$ gas, a HCl gas, a $H_2$ gas, and an Ar gas, which are supplied into the reaction chamber 44, at a predetermined timing.

In a separate mode, the silicon-containing gas ($SiH_4$ gas) and the carbon-containing gas ($C_3H_8$ gas) are supplied from different gas nozzles, and thus it is possible to suppress the deposition of a SiC film in the first gas nozzle 60 and the second gas nozzle 70. That is, since the $SiH_4$ gas and the $C_3H_8$ gas are not mixed in the first gas nozzle 60 and the second gas nozzle 70, it is possible to suppress the deposition of a SiC film on the inner walls thereof. Meanwhile, when the concentrations and the flow velocities of the $SiH_4$ gas and the $C_3H_8$ gas are desired to be adjusted, a carrier gas (Ar gas or $H_2$ gas) having an appropriate flow rate may be supplied thereto.

In addition, the $H_2$ gas used as a reducing gas is supplied through the second gas nozzle 70, and thus it is possible to suppress the deposition of a Si film in the first gas nozzle 60, and to efficiently use the $SiH_4$ gas. That is, the $C_3H_8$ gas and the $H_2$ gas are supplied from the second gas nozzle 70 and the $SiH_4$ gas is supplied from the first gas nozzle 60, and thus the $H_2$ gas can be caused not to be present in the first gas nozzle 60. Thereby, it is possible to suppress the decomposition of the $SiH_4$ gas in the first gas nozzle 60, and to suppress the deposition of a Si film. Meanwhile, in this case, the $H_2$ gas also acts as a carrier gas of the $C_3H_8$ gas. As the carrier gas of the $SiH_4$ gas, an inert gas (particularly, rare gas) such as argon (Ar) is used, and thus it is possible to suppress the deposition of a Si film in the first gas nozzle 60.

The HCl gas used as a chlorine-containing gas is supplied into the first gas nozzle 60, and thus it is possible to suppress the deposition of a Si film in the first gas nozzle 60. That is, even when the $SiH_4$ gas is thermally decomposed in the first gas nozzle 60, and the Si film can be deposited in the first gas nozzle 60, such deposition can be avoided due to a chlorine component contained in the HCl gas. In addition, since there is also an effect of etching the deposited Si film or the like in a chlorine-containing gas, it is possible to suppress the blockage or the like of the first gas supply port 60a more effectively.

The gas supply unit 200 according to the present embodiment is mainly constituted by the first-unit pipe 222a, the second-unit pipe 260a, the third-unit pipe 240a, the valves 212a, 212b, 212c, 212d, and 212f, the MFCs 211a, 211b, 211c, 211d, 211e, and 211f, the $SiH_4$ gas supply source 210a, the HCl gas supply source 210b, the Ar gas supply source 210c, the $C_3H_8$ gas supply source 210d, the $H_2$ gas supply source 210e, and the Ar gas supply source 210f.

In addition, a first gas supply system used as a silicon-containing gas supply system is mainly constituted by the first-unit pipe 222a, the valve 212a, the MFC 211a, the $SiH_4$ gas supply source 210a, the first gas supply pipe 222, the first gas heating mechanism 65, and the first gas nozzle 60. Meanwhile, it may be considered that the valves 212b and 212c, the MFCs 211b and 211c, the HCl gas supply source 210b, and the Ar gas supply source 210c are included in the first gas supply system.

In addition, a second gas supply system used as a carbon-containing gas supply system is mainly constituted by the second-unit pipe 260a, the valve 212d, the MFC 211d, the $C_3H_8$ gas supply source 210d, the second gas supply pipe 260, the second gas heating mechanism 75, and the second gas nozzle 70. Meanwhile, it may also be considered that the valve 212e, the MFC 211e, and the $H_2$ gas supply source 210e are included in the second gas supply system.

In addition, a third gas supply system used as a purge gas (inert gas) supply system is mainly constituted by the third-unit pipe 240a, the valve 212f, the MFC 211f, the Ar gas supply source 210f, and the third gas supply pipe 240.

Next, the gas supply unit 200 formed in a premixed mode will be described with reference to FIG. 4B.

This mode is different from the separate mode, in that the $C_3H_8$ gas supply source 210d that supplies the $C_3H_8$ gas used as a carbon-containing gas is not connected to the upstream end of the second-unit pipe 260a, but to the upstream end of the first-unit pipe 222a. That is, in the premixed mode, the $C_3H_8$ gas supply source 210d is connected to the upstream end of the first-unit pipe 222a through the MFC 211d and the valve 212d. In addition, in the premixed mode, the second gas supply system used as a carbon-containing gas supply system is constituted by the first-unit pipe 222a, valve 212d, the MFC 211d, the $C_3H_8$ gas supply source 210d, the first gas supply pipe 222, the first gas heating mechanism 65, and the first gas nozzle 60.

In the premixed mode, since the $SiH_4$ gas and the $C_3H_8$ gas can be mixed with each other in advance within the first-unit pipe 222a, the first gas supply pipe 222, and the first gas heating mechanism 65, it is possible to more reliably perform the mixing of gases than in the separate mode.

Meanwhile, the $H_2$ gas supply source 210e that supplies the $H_2$ gas which is a reducing gas is preferably connected to the upstream end of the second gas supply pipe 260 through the MFC 211e and the valve 212e. Thereby, the flow rate ratio (Cl/H) of the HCl gas used as an etching gas to the $H_2$ gas used as a reducing gas can be increased within the first gas nozzle 60. As a result, it is possible to increase an etching effect due to a chlorine component contained in the HCl gas, and to suppress the reaction of the $SiH_4$ gas with the $C_3H_8$ gas. Therefore, in the premixed mode, it is also possible to suppress the deposition of a SiC film in the first gas nozzle 60 to some extent.

(Peripheral Configuration of Treatment Furnace)

Next, the treatment furnace 40 and its peripheral configurations will be described with reference to FIG. 6.

As shown in FIG. 6, a load lock chamber 110 used as a spare chamber is provided below the treatment furnace 40. A boat elevator 115 is provided on the external surface of a sidewall constituting the load lock chamber 110. The boat elevator 115 includes a lower substrate 112, a guide shaft 116, a ball screw 118, an upper substrate 120, an elevating motor 122, an elevating substrate 130, and a bellows 128. The lower substrate 112 is fixed to the external surface of the sidewall constituting the load lock chamber 110 in a horizontal posture. The lower substrate 112 is provided with the guide shaft 116 fitted to an elevating platform 114 and the ball screw 118 threadedly engaged with the elevating platform 114 in a vertical posture. The upper substrate 120 is fixed to the upper end of the guide shaft 116 and the ball screw 118 in a horizontal posture. The ball screw 118 is configured to be rotated by the elevating motor 122 provided on the upper substrate 120. The guide shaft 116 is configured to suppress rotation in a horizontal direction while allowing the vertical motion of the elevating platform 114. The elevating platform 114 is lifted up and down by rotating the ball screw 118.

A hollow elevating shaft 124 is fixed to the elevating platform 114 in a vertical posture. A connection portion between the elevating platform 114 and the elevating shaft 124 is formed hermetically. The elevating shaft 124 is configured to be lifted up and down together with the elevating platform 114. The lower end of the elevating shaft 124 passes through a top plate 126 constituting the load lock chamber 110. The inside diameter of a through hole provided in the top plate 126 of the load lock chamber 110 is configured to be larger than the outside diameter of the elevating shaft 124 so that the elevating shaft 124 and the top plate 126 do not come into contact with each other. The bellows 128 used as a hollow expandable body having elasticity is provided between the load lock chamber 110 and the elevating platform 114 so as to cover the periphery of the elevating shaft 124. A connection portion between the elevating platform 114 and the bellows 128 and a connection portion between the top plate 126 and the bellows 128 are formed hermetically, and is configured so that a hermetic state of the inside of the load lock chamber 110 is held. The bellows 128 has a sufficient expansion amount capable of coping with the elevation amount of the elevating platform 114. The inside diameter of the bellows 128 is configured to be sufficiently larger than the outside diameter of the elevating shaft 124 so that the elevating shaft 124 and the bellows 128 do not come into contact with each other.

The elevating substrate 130 is fixed to the lower end of the elevating shaft 124, protruding into the load lock chamber 110, in a horizontal posture. A connection portion between the elevating shaft 124 and the elevating substrate 130 is formed hermetically. A sealing cap 219 is hermetically attached to the upper surface of the elevating substrate 130 with a seal member such as an O-ring interposed therebetween. The sealing cap 219 is made of a metal such as, for example, a stainless steel, and is formed in a discoid shape. By driving the elevating motor 122 to rotating the ball screw 118, and causing the elevating platform 114, the elevating shaft 124, the elevating substrate 130, and the sealing cap 219 to ascend, the boat 30 is loaded into the reaction chamber 44, and the opening (furnace port) of the treatment furnace 40 is blocked by the sealing cap 219. In addition, by driving the elevating motor 122 to rotating the ball screw 118, and causing the elevating platform 114, the elevating shaft 124, the elevating substrate 130, and the sealing cap 219 to descend, the boat 30 is unloaded from the inside of the reaction chamber 44. A drive control unit 108 is electrically connected to the elevating motor 122. The drive control unit 108 controls the boat elevator 115 so as to perform a desired operation at a desired timing.

A drive cover 132 is hermetically attached to the lower surface of the elevating substrate 130 with a seal member such as an O-ring interposed therebetween. A drive accommodating case 140 is constituted by the elevating substrate 130 and the drive cover 132. The inside of the drive accommodating case 140 is set apart from the atmosphere within the load lock chamber 110. A rotation mechanism 104 is provided in the inside of the drive accommodating case 140. A power supply cable 138 is connected to the rotation mechanism 104. The power supply cable 138 is led from the upper end of the elevating shaft 124 through the inside of the elevating shaft 124 to the rotation mechanism 104, and supplies power to the rotation mechanism 104. The upper end of a rotary shaft 106 included in the rotation mechanism 104 passes through the sealing cap 219, and supports the boat 30 used as a substrate holding tool from below. The rotation mechanism 104 is brought into operation, thereby allowing the wafer 14 held by the boat 30 to be rotated within the reaction chamber 44. The drive control unit 108 is electrically connected to the rotation mechanism 104. The drive control unit 108 controls the rotation mechanism 104 so as to perform a desired operation as a desired timing.

In addition, a cooling mechanism 136 is provided at the inside of the drive accommodating case 140 and in the periphery of the rotation mechanism 104. A cooling flow channel 140a is formed in the cooling mechanism 136 and the sealing cap 219. A cooling water pipe 142 that supplies cooling water is connected to the cooling flow channel 140a. The cooling water pipe 142 is led from the upper end of the elevating shaft 124 through the inside of the elevating shaft 124 to the cooling flow channel 140a, and supplies cooling water to the cooling flow channel 140a.

(Control Unit)

Next, the configuration of a controller 152 that controls the semiconductor manufacturing apparatus 10 will be described with reference to FIG. 5.

FIG. 5 is a block configuration diagram of the controller 152 used as a control unit that controls an operation of each unit constituting the semiconductor manufacturing apparatus 10. The controller 152 includes a main control unit 150, the temperature control unit 52 electrically connected to the main control unit 150, the gas flow rate control unit 78, the pressure control unit 98, and the drive control unit 108. In addition, the main control unit 150 further includes an operation unit and an input and output unit.

The temperature control unit 52 perform control so that the temperature of the inside of the reaction chamber 44 has a desired temperature distribution by regulating the state of electrical conduction from the AC power supply 500 to the induction coil 50 on the basis of temperature information detected by the temperature sensor 510. In addition, the gas flow rate control unit 78 controls the MFCs 211a, 211b, 211c, 211d, 211e, and 211f so that the flow rates of the $SiH_4$ gas, the HCl gas, the $C_3H_8$ gas, the $H_2$ gas, and the Ar gas supplied into the reaction chamber 44 are equal to predetermined flow rates, respectively, at a predetermined timing, and controls the valves 212a, 212b, 212c, 212d, and 212f through an electromagnetic valve unit. In addition, the pressure control unit 98 performs control so that the pressure of the inside of the reaction chamber 44 is equal to a predetermined pressure at a predetermined timing by performing feedback control on the degree of opening of the APC valve 214 on the basis of pressure information measured in the pressure sensor 520. The drive control unit 108 controls the boat elevator 115, the rotation mechanism 104 and the like so as to perform desired operations at a desired timing.

(2) Substrate Processing Step

Next, a description will be made of a substrate processing step of forming, for example, a SiC film on the wafer 14 used as a substrate made of SiC or the like, as one of steps of manufacturing a semiconductor device, using the above-mentioned semiconductor manufacturing apparatus 10. Meanwhile, in the following description, the operation of each unit constituting the semiconductor manufacturing apparatus 10 is controlled by the controller 152.

First, the pod 16 in which plural wafers 14 are accommodated is placed on the pod stage 18. The pod 16 is then moved from the top of the pod stage 18 to the top of the pod storage rack 22 by the pod transport apparatus 20. The pod 16 placed on the pod storage rack 22 is transported to the pod opener 24 by the pod transport apparatus 20. The cover of the pod 16 is opened by the pod opener 24, and the number of wafers 14 accommodated in the pod 16 is detected by the substrate number detector 26.

Next, the wafer 14 is extracted from the pod 16 located at a position of the pod opener 24 by the substrate transfer machine 28, and is moved to the boat 30.

When plural wafers 14 are loaded in the boat 30, the boat 30 in which the plural wafers 14 are held is caused to ascend through the elevating operation of the elevating platform 114 and the elevating shaft 124 using the elevating motor 122, and is loaded into the reaction chamber 44. When the loading thereof is completed, a sealing cap 102 seals the lower end of the manifold 36 with an O-ring (not shown) interposed therebetween.

After the boat 30 is loaded, the boat 30 and the wafer 14 is started to be rotated in a circumferential direction by the rotation mechanism 104. The inside of the reaction chamber 44 is evacuated by the vacuum pump 220 so as to have a predetermined pressure (degree of vacuum). At this time, the pressure of the inside of the reaction chamber 44 is measured by the pressure sensor 520, and feedback control is performed on the degree of opening of the APC valve 214 provided in the exhaust pipe 230 on the basis of measured pressure information. In addition, an AC power of, for example, 10 to 200 kW at 10 to 100 kHz is supplied from the AC power supply 500 to the induction coil 50, and the induced body 48 is caused to generate heat by applying an AC magnetic field to the induced body 48 to thereby pass an induction current through the induced body 48. The temperature of the wafer 14 held by the boat 30 or the temperature of the inside of the reaction chamber 44 is then raised to a temperature range of, for example, 1500° C. to 1800° C. due to radiant heat emanating from the induced body 48. At this time, feedback control is performed on the state of electrical conduction from AC power supply 500 to the induction coil 50 on the basis of temperature information detected by the temperature sensor so that the inside of the reaction chamber 44 has a predetermined temperature distribution. Meanwhile, as described later, the first gas heating mechanism 65 and the second gas heating mechanism 75 which are provided within the induced body 48 are heated by radiant heat from the induced body 48.

Subsequently, the $SiH_4$ gas used as a silicon-containing gas, the HCl gas used as a chlorine-containing gas, the $C_3H_8$ gas used as a carbon-containing gas, and the $H_2$ gas used as a hydrogen-containing gas are started to be supplied into the reaction chamber 44.

That is, with the valves 212a and 212b being opened, the $SiH_4$ gas and the HCl gas of which the flow rates are controlled by the MFCs 211a and 211b are supplied into the first gas nozzle 60 through the first gas supply pipe 222 and the first gas heating mechanism 65. The $SiH_4$ gas and the HCl gas supplied into the first gas nozzle 60 are supplied from the first gas supply port 60a into the reaction chamber 44 (accommodating region of the wafer 14). In addition, at this time, with the valve 212c being opened, the Ar gas of which the flow rate is controlled by the MFC 211c may be supplied into the first gas nozzle 60 through the first gas supply pipe 222 and the first gas heating mechanism 65. The Ar gas acts as a carrier gas of the $SiH_4$ gas. In a SiC epitaxial growth, particularly, a large amount of carrier gas may be required. Meanwhile, as described later, the $SiH_4$ gas, the HCl gas and the like which are supplied into the first gas nozzle 60 are heated by passing through the heated first gas heating mechanism 65.

In addition, at this time, with the valves 212e and 212d being opened, the $C_3H_8$ gas and the $H_2$ gas of which the flow rates are controlled by the MFCs 211e and 211d are supplied into the second gas nozzle 70 through the second gas supply pipe 260 and the second gas heating mechanism 75. The $C_3H_8$ gas and the $H_2$ gas supplied into the second gas nozzle 70 are supplied from the second gas supply port 70a into the reaction chamber 44 (accommodating region of the wafer 14). At this time, the $H_2$ gas acts as a carrier gas of the $C_3H_8$ gas. Meanwhile, as described later, the $C_3H_8$ gas and the $H_2$ gas which are supplied into the second gas nozzle 70 are heated by passing through the heated second gas heating mechanism 75.

The processing gas ($SiH_4$ gas, HCl gas, $C_3H_8$ gas, $H_2$ gas and the like) supplied into the reaction chamber 44 (accommodating region of the wafer 14) flows parallel to the wafer 14 through the inside of the induced body 48, and then flows toward the lower side of the induced body 48 through the regions provided with the first gas heating mechanism 65, the second gas heating mechanism 75, and the boat thermal insulating portion 34, and is exhausted from the first exhaust port 90. The entirety of the wafer 14 is then exposed to the processing gas efficiently and uniformly, and a SiC film is epitaxially grown on the surface of the wafer 14. Meanwhile, as described later, the first gas heating mechanism 65 and the second gas heating mechanism 75 are heated by being exposed to a high-temperature exhaust gas (heated processing gas).

In addition, at this time, with the valve 212f being opened, the Ar gas of which the flow rate is controlled by the MFC 211f is supplied from the third gas supply port 360 into the reaction chamber 44. The Ar gas supplied into the reaction chamber 44 acts as a purge gas, flows between the reaction tube 42 and the insulating body 54, and is exhausted from the second exhaust port 390. Thereby, it is possible to suppress to the infiltration of a processing gas to between the reaction tube 42 and the insulating body 54, and to prevent unnecessary products or the like from being attached to the surfaces thereof.

When a preset time elapses, and a SiC film having a predetermined thickness is epitaxially grown, the valves 212a, 212b, 212e, and 212d are closed, and the supply of the $SiH_4$ gas, the HCl gas, the $C_3H_8$ gas, and the $H_2$ gas into the reaction chamber 44 is stopped. In addition, the supply of power to the induction coil 50 is stopped. The Ar gas is then supplied to the inside of the induced body 48 by opening the valve 212c (or in a state where the valve is opened). A gas of the inside of the induced body 48 is replaced by the Ar gas, and the pressure of the inside of the reaction chamber 44 is returned to normal pressure by adjusting the degree of opening of the APC valve 214. In addition, the valve 212f is in an open state.

Thereafter, when the temperatures of all the wafers 14 supported by the boat 30 drop up to a predetermined unload temperature (for example 500° C. or lower), the sealing cap 219 is caused to descend using the elevating motor 122, the lower end of the manifold 36 is opened, and the boat 30 in which the processed wafer 14 is held is unloaded from the lower end of the manifold 36 to the outside of the reaction tube 42. Until the temperatures of all the wafers 14 supported by the boat 30 drop to a transport temperature (for example, 90° C. or lower), the boat 30 is cause to stand by at a predetermined position. When the wafer 14 of the boat 30 which is caused to stand by is cooled up to a predetermined transport temperature, the wafer 14 is extracted from the boat 30 by the substrate transfer machine 28, transported to the empty pod 16 which is set by the pod opener 24 and accommodated therein. Thereafter, the pod 16 in which the wafer 14 is accommodated is transported to the pod storage rack 22 or the pod stage 18 by the pod transport apparatus 20. In this manner, the substrate processing step according to the present embodiment is completed.

(3) Gas Heating Mechanism

As stated above, in the substrate processing apparatus that forms a SiC film, since the temperature of the wafer 14 is raised to 1500° C. to 1800° C., the processing gas ($SiH_4$ gas, HCl gas, $C_3H_8$ gas, $H_2$ gas and the like) supplied to the wafer 14 is also required to be heated to a high temperature in advance. When such heating is performed sufficiently, the processing gas is supplied to the wafers 14 in a state where the temperature thereof is low, and thus temperature uniformity or the like between the wafers 14 may deteriorate.

As a device that heats the processing gas supplied into a processing chamber in advance, a preheating device including a heating plate having a large heat capacity therein is known. However, it is assumed that such a preheating device is provided outside the processing chamber, and the supply of a heated gas into the processing chamber is required to be performed using a gas supply pipe that connects the preheating device and the processing chamber. In such a configuration, it is difficult to heat the processing gas in excess of the heat resistant temperature of the gas supply pipe. In addition, since the preheating device and the processing chamber are installed separately from each other, the temperature of the processing gas may drop before the processing gas reaches the processing chamber, and thus it is difficult to efficiently supply the heated gas to a substrate.

Consequently, in the present embodiment, the inside of the induced body 48 constituting a heating portion is provided with the first gas heating mechanism 65 that supplies the processing gas ($SiH_4$ gas, HCl gas, and Ar gas) from the upstream side of the first gas nozzle 60 into the first gas nozzle 60 and the second gas heating mechanism 75 that supplies the processing gas ($C_3H_8$ gas and $H_2$ gas) from the upstream side of the second gas nozzle 70 into the second gas nozzle 70, and thus the above-mentioned problem is solved. Hereinafter, the configurations and operations of the first gas heating mechanism 65 and the second gas heating mechanism 75 will be described with reference to FIGS. 2 and 7.

(Arrangement of Gas Heating Mechanism)

As shown in FIG. 2, the first gas heating mechanism 65 and the second gas heating mechanism 75 are provided inside the induced body 48 constituting a heating portion. The lower end of the induced body 48 constituting the heating portion is formed to be lower than the upper end of the first gas heating mechanism 65 and the second gas heating mechanism 75. That is, the lateral portion of the first gas heating mechanism 65 and the second gas heating mechanism 75 is formed to be surrounded by the induced body 48. Thereby, when the induced body 48 is inductively heated in order to heat the wafer 14, the first gas heating mechanism 65 and the second gas heating mechanism 75 are also efficiently heated by radiant heat emanating from the induced body 48.

In addition, the first gas heating mechanism 65 and the second gas heating mechanism 75 are disposed at a position exposed to a high-temperature exhaust gas (processing gas). The processing gas supplied from the inside of the first gas nozzle 60 and the second gas nozzle 70 into the reaction chamber 44 flows along the inside of the induced body 48 heated to a high temperature and comes into contact with the wafer 14 heated to a high temperature, and thus is heated to a high temperature. The heated processing gas flows toward the lower side of the induced body 48 through the regions provided with the first gas heating mechanism 65, the second gas heating mechanism 75, and the boat insulating portion 34, and is exhausted from the first exhaust port 90. At this time, the first gas heating mechanism 65 and the second gas heating mechanism 75 is exposed to a high-temperature exhaust gas (processing gas), and is efficiently heated.

In this manner, in the present embodiment, the first gas heating mechanism 65 and the second gas heating mechanism 75 are disposed at the position heated to a high temperature, that is, the inside of the induced body 48 and the position exposed to a high-temperature exhaust gas. Thereby, it is possible to effectively heat (preheat) the processing gas supplied to the accommodating region of the wafer 14. That is, by heating the first gas heating mechanism 65 and the second gas heating mechanism 75, it is possible to sufficiently heat (preheat) the processing gas (processing gas passing through the first gas heating mechanism 65 and the second gas heating mechanism 75) supplied into the first gas nozzle 60 and the second gas nozzle 70, and to supply the high-temperature processing gas to the accommodating region of the wafer 14.

In addition, in the present embodiment, heat exchange with the high-temperature exhaust gas is performed in the first gas heating mechanism 65 and the second gas heating mechanism 75, and thus the temperature of the exhaust gas can be effectively lowered. Thereby, it is possible to maintain the temperature of constituent member located below the treatment furnace 40 to the temperature of, for example, 200° C. or lower, and to reduce thermal damage (damage due to the flow of the high-temperature processing gas) applied to these constituent members.

In addition, in the present embodiment, since the processing gas can be effectively heated by the first gas heating mechanism 65 and the second gas heating mechanism 75, it is possible to reduce power supplied to the induction coil 50.

In addition, in the present embodiment, a preheating device for exclusive use may not be provided outside the treatment furnace 40. Therefore, it is possible to heat the processing gas without being subject to the limitation of the heat resistant temperature of the gas supply pipe. In addition, since the first gas heating mechanism 65 and the second gas heating mechanism 75 are provided within the reaction chamber 44 (that is, in the vicinity of the wafer 14), it is possible to effectively supply the heated processing gas to the wafer 14.

(Flow Channel Configuration of Gas Heating Mechanism)

Meanwhile, in the above-mentioned configuration, in order to efficiently heat the processing gas supplied to the accommodating region of the wafer 14, it is important to stimulate heat exchange (heat transfer) between the gas heating mechanism and the processing gas. However, when the gas flow channel of the gas heating mechanism is formed similarly to the gas nozzle shown in, for example, a transverse cross-sectional view of FIG. 7C, the processing gas is heated in the outer circumferential portion of the gas flow channel (vicinity of the inner wall of the gas flow channel), but the processing gas may be insufficient heated in the central portion thereof.

Consequently, in the present embodiment, the processing gas is efficiently heated by increasing the ratio of the flow channel circumferential length to the flow channel cross-sectional area in the gas flow channel of the first gas heating mechanism 65 and the second gas heating mechanism 75. Hereinafter, the flow channel configuration of the gas heating mechanism will be described with reference to FIGS. 7A to 7D. Meanwhile, the configurations of the first gas heating mechanism 65 and the second gas heating mechanism 75 are the same as each other, and thus the first gas heating mechanism 65 will be described by way example.

As shown in FIGS. 7A and 7B, the first gas heating mechanism 65 is formed as a columnar member having, for example, a cylindrical shape. The first gas heating mechanism 65 is provided with a gas flow channel constituted by plural holes (through holes) 65a. The gas flow channel constituted by plural holes 65a communicates with the inside of the first gas supply pipe 222 and the inside of the first gas nozzle 60. Meanwhile, the outside diameter of the first gas heating mechanism 65 is configured to be larger than the outside diameter of the first gas nozzle 60.

In such a configuration as stated above, the sum of areas of plural holes 65a is equal to a flow channel cross-sectional area (A) of the gas flow channel of the first gas heating mechanism 65, and the sum of circumferential lengths of plural holes 65a is equal to a flow channel circumferential length (S) of the gas flow channel of the first gas heating mechanism 65. Meanwhile, since the first gas nozzle 60 is formed in a simple cylindrical shape, the cross-sectional area of its hollow portion is equal to a flow channel cross-sectional area (A') of the gas flow channel of the first gas nozzle 60, and the inner circumferential length thereof is equal to a flow channel circumferential length (S') of the gas flow channel of the first gas nozzle 60. Here, the gas flow channel is formed by providing plural holes 65a having a small diameter. Therefore, the total flow channel circumferential length (S) of the gas flow channels of the first gas heating mechanism 65 becomes larger than the flow channel circumferential length (S') of the gas flow channel of the first gas nozzle 60. In addition, when the total flow channel cross-sectional area (A) of the gas flow channels of the first gas heating mechanism 65 and the flow channel cross-sectional area (A') of the gas flow channel of the first gas nozzle 60 are the same as each other so as to match the flow velocity of a gas flowing in the first gas heating mechanism 65 with the flow velocity of a gas flowing in the first gas nozzle 60, the ratio (S/A) of the flow channel circumferential length (S) to the flow channel cross-sectional area (A) in the gas flow channel (plural holes 65a) of the first gas heating mechanism 65 becomes larger than the ratio (S'/A') of the flow channel circumferential length (S') to the flow channel cross-sectional area (A') in the gas flow channel of the first gas nozzle 60.

As a result, the processing gas passing through the gas flow channel of the first gas heating mechanism 65 is effectively brought into contact with the inner wall of the heated gas flow channel (plural holes 65a). Heat exchange between the first gas heating mechanism 65 and the processing gas is stimulated, and thus the processing gas is heated more efficiently.

Hereinafter, the amount of heat supplied to the processing gas from the inner wall of the gas flow channel will be described.

For example, when the temperature of the inner wall of the gas flow channel is Tw[K], the temperature of the processing gas is Tf[K], the inside diameter of the gas flow channel is d[m], the length of the gas flow channel is l[m], and the heat transfer coefficient is h[W/m²K], the amount of heat Q[W] supplied from the inner wall of the gas flow channel to the processing gas is as follows.

$$Q = h(T_W - T_f) d\pi l \quad \text{[Expression 1]}$$

In addition, a heat transfer coefficient h, a Nusselt number Nu, and a Reynolds number Re are as follows. Meanwhile, in the following each expression, λ represents a thermal conductivity [W/mK] of the processing gas, Pr represents a Prandtl number, u represents a flow velocity [m/sec] of the processing gas, and v represents a kinematic viscosity coefficient [m²/S].

$$h = \frac{\lambda Nu}{d} \quad \text{[Expression 2]}$$

$$Nu = 0.023 Re^{0.8} Pr^{0.4} \quad \text{[Expression 3]}$$

$$Re = \frac{ud}{v} \quad \text{[Expression 4]}$$

Here, physical property values (λ, v, Pr) are assumed to be constant, and the sequential substitution of the above expressions is as follows.

$$Nu = 0.023\left(\frac{ud}{v}\right)^{0.8} Pr^{0.4}$$ [Expression 5]

$$h = \frac{\lambda}{d} \times 0.023\left(\frac{ud}{v}\right)^{0.8}$$ [Expression 6]

$$Pr^{0.4} = 0.023\lambda \times \frac{u^{0.8}}{v^{0.8} d^{0.2}} Pr^{0.4}$$

$$\therefore Q = 0.023\lambda \times \frac{u^{0.8}}{v^{0.8} d^{0.2}} Pr^{0.4} \times (T_W - T_f) d\pi l =$$ [Expression 7]

$$C(T_W - T_f)(ud)^{0.8}$$

Therefore, the amount of heat Q[W] supplied to the processing gas from the inner wall of the gas flow channel is as follows.

$$Q \propto (ud)^{0.8} \propto \left(\frac{\dot{m}}{d}\right)^{0.8}$$ [Expression 8]

Here, the following expression represents a flow rate, and $$\dot{m}$$ [Expression 9]

the following relation is established.

$$\dot{m} = = ud^2$$ [Expression 10]

From the above, the ratio of the amount of heat Q[W] supplied to the processing gas from the inner wall of the gas flow channel to the flow rate of the processing gas to be heated is as follows. Meanwhile, in the following expression, S represents the flow channel circumferential length [m] of the gas flow channel, and A represents the flow channel cross-sectional area [m²] of the gas flow channel. From such a result, in order to effectively heat the processing gas having a certain flow rate, it is understood that it is effective to lower the flow velocity of the processing gas, or to reduce the inside diameter of the gas flow channel (that is, increase the ratio of the heat transfer surface area to the flow channel cross-sectional area).

$$\frac{Q}{\dot{m}} \propto \frac{(ud)^{0.8}}{ud^2} = \frac{1}{u^{0.2} d^{1.2}} \propto \frac{1}{u^{0.2}} \left(\frac{S}{A}\right)^{1.2}$$ [Expression 11]

In the present embodiment, as shown in FIGS. 7A and 7B, as many holes 65a and 75a as possible having a small diameter are disposed, and the gas flow channel having a large ratio (S/A) of the flow channel circumferential length (S) to the flow channel cross-sectional area (A) is formed. Thereby, it is possible to satisfy the above-mentioned requirements, and to heat the processing gas more efficiently.

Meanwhile, in the present embodiment, even when the heat capacities of the first gas heating mechanism 65 and the second gas heating mechanism 75 are sufficiently large, and the processing gas having a temperature Tf[K] flows through the gas flow channel, it is considered that the temperature of the inner wall of the gas flow channel can be maintained to a constant temperature Tw[K].

Meanwhile, in the present embodiment, the outside diameter of the first gas heating mechanism 65 is configured to be larger than the outside diameter of the first gas nozzle 60. Similarly, the outside diameter of the second gas heating mechanism 75 is configured to be larger than the outside diameter of the second gas nozzle 70. Thereby, more holes 65a and 75a can be disposed inside the first gas heating mechanism 65 and the second gas heating mechanism 75. As a result, it is possible to further increase the ratio of the flow channel circumferential length (S) to the flow channel cross-sectional area (A) of the gas flow channel, and to heat the processing gas more efficiently. In addition, for example, as shown in FIG. 7D, the holes 65a and 75a are disposed in a zigzag shape, and thus more holes 65a and 75a can be disposed. Meanwhile, when seen from the viewpoint of the gas flow velocity, the total flow channel cross-sectional area (A) of the gas flow channels of the first gas heating mechanism 65 and the flow channel cross-sectional area (A') of the gas flow channel of the first gas nozzle 60 are preferably the same as each other, but this may be difficult in view of physical arrangement. Even in that case, when the ratio (S/A) of the flow channel circumferential length (S) to the flow channel cross-sectional area (A) is made larger in the first gas heating mechanism 65, it is possible to obtain an effect of the present invention.

Second Embodiment of the Present Invention

Figure 9:
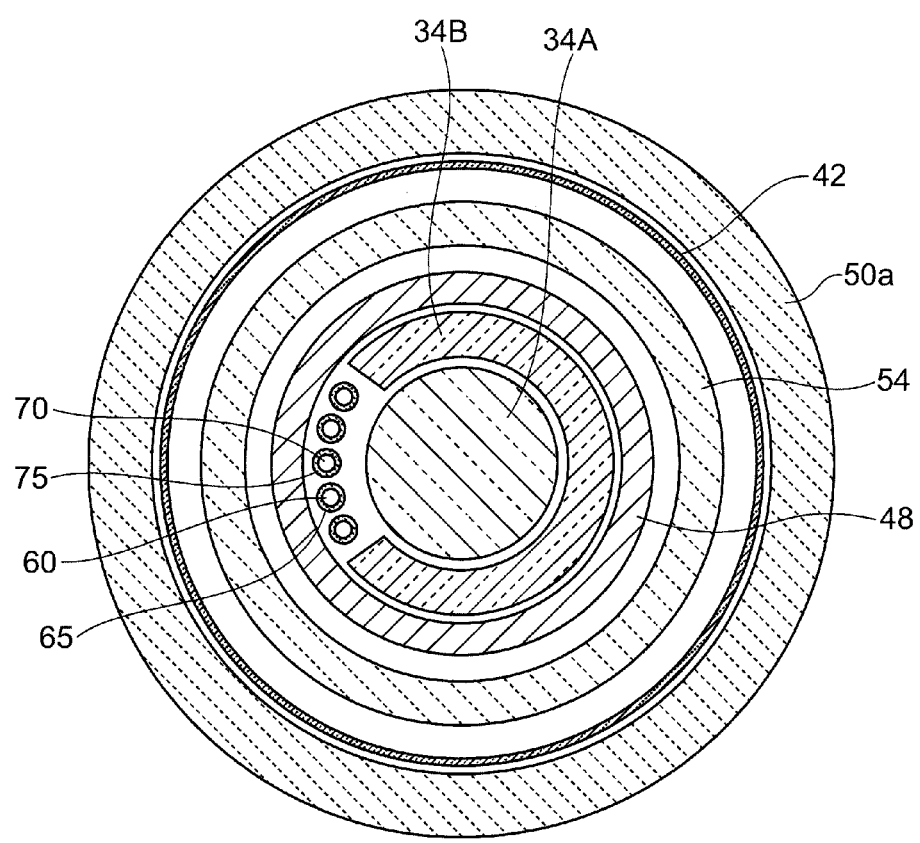
FIG. 9 is a transverse cross-sectional view of a treatment furnace according to a second embodiment of the present invention.

In the present embodiment, the configuration of a boat thermal insulating portion is different from that of the first embodiment. FIG. 9 is a transverse cross-sectional view of the treatment furnace 40 according to the present embodiment.

As shown in FIG. 9, the boat thermal insulating portion according to the present embodiment includes a hollow cylindrical columnar thermal insulating portion 34A and an annular thermal insulating portion 34B that surrounds the outer circumference of the columnar thermal insulating portion 34A. The columnar thermal insulating portion 34A is formed in a hollow cylindrical shape similarly to the boat thermal insulating portion of the first embodiment, and supports the boat 30 from below. In addition, the annular thermal insulating portion 34B is formed in a hollow cylindrical shape having a C-type transverse cross-section so as to surround the columnar thermal insulating portion 34A over a wide range in a circumferential direction and a height direction, with the exception of regions provided with a first gas heating mechanism 65 and a second gas heating mechanism 75. A flow channel of an exhaust gas (processing gas) having a narrow width is annularly formed between the columnar thermal insulating portion 34A and the annular thermal insulating portion 34B. Meanwhile, the columnar thermal insulating portion 34A and the annular thermal insulating portion 34B are formed of a heat resistant material such as, for example, quartz or SiC.

According to the present embodiment, the flow channel of the high-temperature exhaust gas (processing gas) on the downstream side can be made narrower than in the first embodiment. Thereby, it is possible to more reliably bring the high-temperature exhaust gas into contact (collision) with the first gas heating mechanism 65, the second gas heating mechanism 75, and the boat thermal insulating portion (columnar thermal insulating portion 34A and annular thermal insulating portion 34B). In addition, by making the flow channel of the exhaust gas between the columnar thermal insulating portion 34A and the annular thermal insulating portion 34B narrower than the flow channel of the exhaust gas in the periphery of the first gas heating mechanism 65 and the second gas heating mechanism 75, it is possible to stimulate (concentrate) the supply of the exhaust gas to the periphery of the first gas heating mechanism 65 and the second gas heating mechanism 75. As a result, it is possible to stimulate heat exchange between the first gas heating mechanism 65 and the second gas heating mechanism 75, and the high-temperature exhaust gas, and to heat the first gas heating mechanism 65 and the second gas heating mechanism 75 more efficiently. In addition, it is possible to cool the high-temperature exhaust gas effectively, and to reduce thermal damage applied to constituent members located below the treatment furnace 40.

Third Embodiment of the Present Invention

Figure 11A:
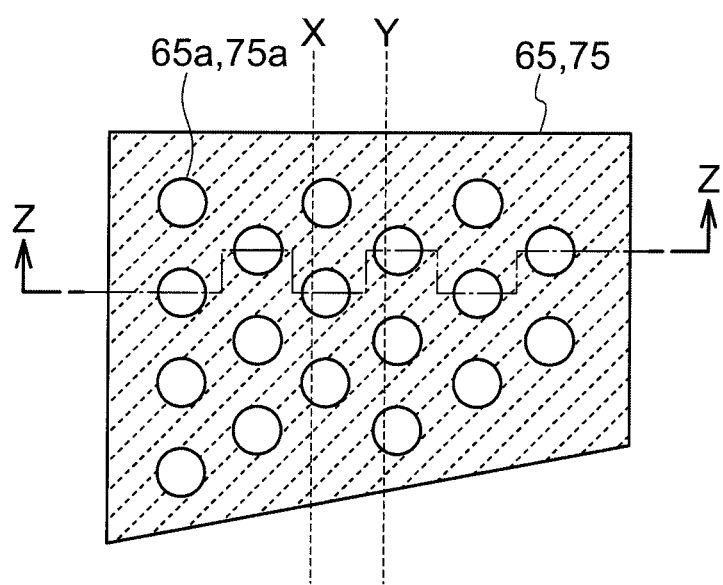
FIG. 11A is a transverse cross-sectional view of a gas heating mechanism according to the third embodiment of the present invention.
Figure 11B:
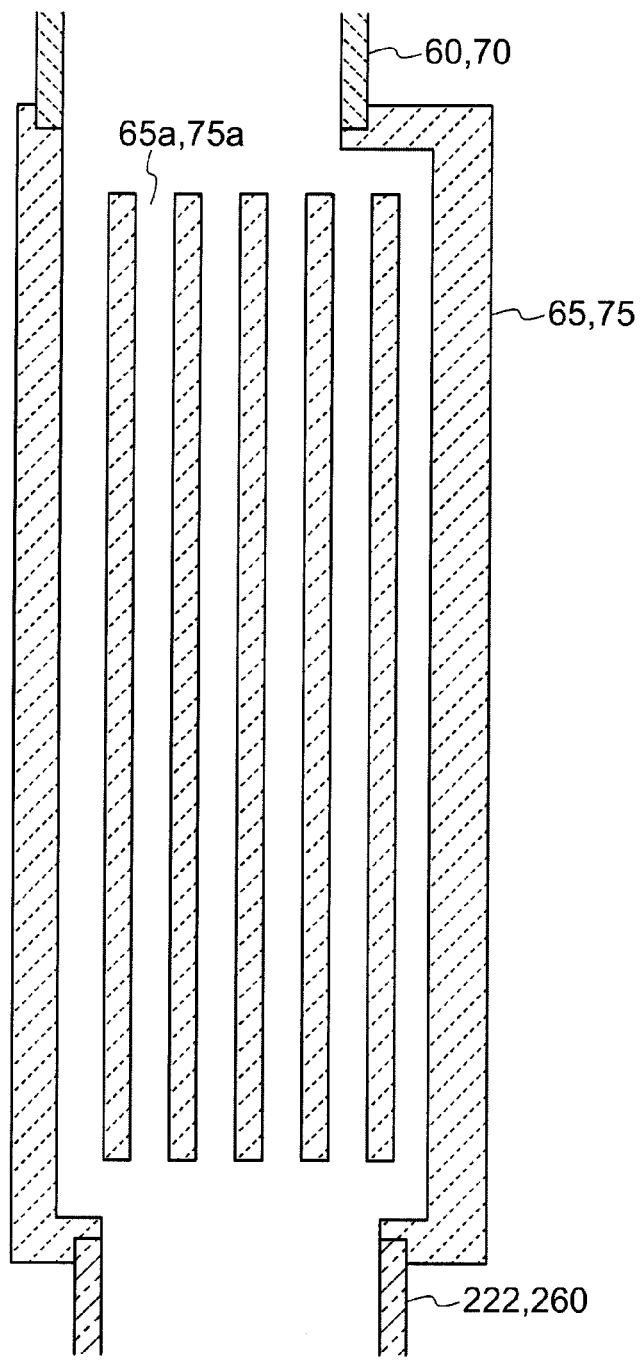
FIG. 11B is a longitudinal cross-sectional view taken along line ZZ of FIG. 11A.

In the present embodiment, the configuration of a gas heating mechanism is different from that of the second embodiment. FIG. 10 is a transverse cross-sectional view of a treatment furnace 40 according to the present embodiment. FIG. 11A is a transverse cross-sectional view of the gas heating mechanism according to the present embodiment, and FIG. 11B is a longitudinal cross-sectional view taken along line ZZ.

As shown in FIG. 10, a first gas heating mechanism 65 and a second gas heating mechanism 75 according to the present embodiment are arranged in an arc shape in an arc-shaped gap which is not provided with the annular thermal insulating portion 34B. As shown in FIG. 11A, the first gas heating mechanism 65 and the second gas heating mechanism 75 are formed as a columnar member of which the transverse cross-section has, for example, a trapezoidal shape. Meanwhile, the center line (X in the drawing) of the first gas nozzle 60 and the second gas nozzle 70 is provided at a position further away from the wafer 14 than the center line (Y in the drawing) of the first gas heating mechanism 65 and the second gas heating mechanism 75. That is, the first gas heating mechanism 65 and the second gas heating mechanism 75 are provided close to the wafer 14 (columnar thermal insulating portion 34A), whereas the first gas nozzle 60 and the second gas nozzle 70 are provided at positions away from the wafer 14 by a predetermined distance.

According to the present embodiment, the flow channel of the high-temperature exhaust gas (processing gas) on the downstream side can be made narrower than in the second embodiment, particularly, in the periphery of the first gas heating mechanism 65 and the second gas heating mechanism 75. Thereby, it is possible to reliably bring the high-temperature exhaust gas into contact (collision) with the first gas heating mechanism 65, the second gas heating mechanism 75, and the boat thermal insulating portion (columnar thermal insulating portion 34A and annular thermal insulating portion 34B). It is possible to stimulate heat exchange between the first gas heating mechanism 65 and the second gas heating mechanism 75, and the high-temperature exhaust gas, and to heat the first gas heating mechanism 65 and the second gas heating mechanism 75 more efficiently. In addition, it is possible to cool the high-temperature exhaust gas effectively, and to reduce thermal damage applied to constituent members located below the treatment furnace 40.

In addition, according to the present embodiment, the center line of the first gas nozzle 60 and the second gas nozzle 70 is provided at a position further away from the wafer 14 than the center line of the first gas heating mechanism 65 and the second gas heating mechanism 75. That is, the first gas nozzle 60 and the second gas nozzle 70 are provided at positions away from the wafer 14 side by a predetermined distance. Thereby, it is possible to stimulate the mixing of the processing gases supplied to the wafer 14.

In addition, according to the present embodiment, since the first gas heating mechanism 65 and the second gas heating mechanism are configured to extend in the direction of the wafer 14 as compared to the first embodiment and the second embodiment, it is possible to form more holes 65a and 75a, and to improve heating efficiency.

In addition, the holes 65a and 75a are disposed in a zigzag shape, and thus it is possible to dispose more holes 65a and 75a.

Fourth Embodiment of the Present Invention

Figure 12B:
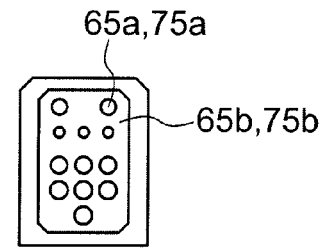
FIG. 12B is a transverse cross-sectional view taken along line AA of the first gas heating mechanism and the second gas heating mechanism according to the fourth embodiment of the present invention.
Figure 12C:
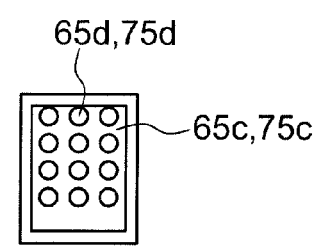
FIG. 12C is a transverse cross-sectional view taken along line BB of the first gas heating mechanism and the second gas heating mechanism according to the fourth embodiment of the present invention.
Figure 12D:
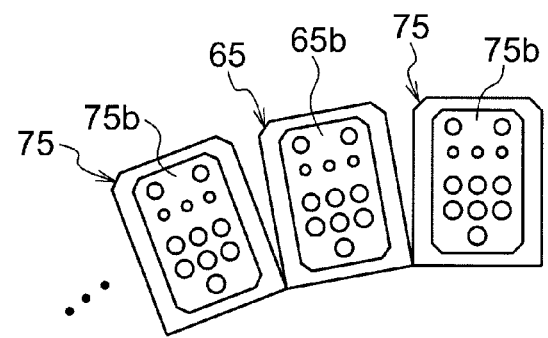
FIG. 12D is a transverse cross-sectional view illustrating the arrangement of the first gas heating mechanism and the second gas heating mechanism according to the fourth embodiment of the present invention.

In the present embodiment, the configuration of a gas heating mechanism is different from those of the first to third embodiments. FIG. 12A is a longitudinal cross-sectional view of a first gas heating mechanism and a second gas heating mechanism according to the present embodiment. FIG. 12B is a transverse cross-sectional view taken along line AA. FIG. 12C is a transverse cross-sectional view taken along line BB. FIG. 12D is a transverse cross-sectional view illustrating the arrangement of the first gas heating mechanism and the second gas heating mechanism according to the fourth embodiment of the present invention.

As shown in FIG. 12A, the first gas heating mechanism 65 and the second gas heating mechanism 75 include a first gas heating mechanism body 65b and a second gas heating mechanism body 75b, and a gas heating mechanism joint 65c and a second gas heating mechanism joint 75c, respectively. The gas heating mechanism joint 65c and the second gas heating mechanism joint 75c are connected to the lower side (upstream side) of the first gas heating mechanism body 65b and the second gas heating mechanism body 75b, and the first gas nozzle 60 and the second gas nozzle 70 are connected to the upper side (downstream side) of the first gas heating mechanism body 65b and the second gas heating mechanism body 75b. The first gas supply pipe 222 (see FIG. 2A) and the second gas supply pipe 260 (see FIG. 2A) are connected to the lower side (upstream side) of the gas heating mechanism joint 65c and the second gas heating mechanism joint 75c.

As shown in FIG. 12B, the first gas heating mechanism body 65b and the second gas heating mechanism body 75b are formed as a columnar member of which the transverse cross-section has, for example, a substantially rectangular shape. As shown in FIG. 12D, the first gas heating mechanism 65 and the second gas heating mechanism 75 are alternately disposed. When the first gas heating mechanism 65 and the second gas heating mechanism 75 are provided one by one, these mechanisms are disposed adjacent to each other, or with a predetermined space therebetween.

The first gas heating mechanism 65 and the second gas heating mechanism 75 of the present embodiment are disposed at the same places as those of the first gas heating mechanism 65 and the second gas heating mechanism 75 of the first embodiment. Therefore, the first gas heating mechanism 65 and the second gas heating mechanism 75 are heated by radiant heat emanating from the induced body 48 and the high-temperature exhaust gas (processing gas). As a result, the processing gas supplied to the accommodating region of the wafer 14 can be effectively preheated by the first gas heating mechanism 65 and the second gas heating mechanism 75.

The first gas heating mechanism body 65b and the second gas heating mechanism body 75b are provided with a gas flow channel constituted by plural holes (through hole) 65a and a gas flow channel constituted by plural holes (through hole) 75a, respectively. The gas flow channel constituted by plural holes 65a and the gas flow channel constituted by plural holes 75a communicate with the inside of the first gas nozzle 60 and the inside of the second gas nozzle 70, respectively.

The sum of cross-sectional areas of plural holes 65a is equal to a flow channel cross-sectional area (A1) of the gas flow channel of the first gas heating mechanism body 65b, and the sum of the circumferential length of plural holes 65a is equal to a flow channel circumferential length (S1) of the gas flow channel of the first gas heating mechanism body 65b. In addition, the sum of cross-sectional areas of plural holes 75a is equal to a flow channel cross-sectional area (A2) of the gas flow channel of the second gas heating mechanism body 75b, and the sum of circumferential lengths of the plural holes 75a is equal to a flow channel circumferential length (S2) of the gas flow channel of the second gas heating mechanism body 75b. The ratio (S1/A1) of the flow channel circumferential length (S1) to the flow channel cross-sectional area (A1) in the gas flow channel (plural holes 65a) of the first gas heating mechanism body 65b is larger than the ratio (S1'/A1') of a flow channel circumferential length (S1') to a flow channel cross-sectional area (A1') in the gas flow channel of the first gas nozzle 60, and the ratio (S2/A2) of the flow channel circumferential length (S2) to the flow channel cross-sectional area (A2) in the gas flow channel (plural holes 75a) of the second gas heating mechanism body 75b is larger than the ratio (S2'/A2') of a flow channel circumferential length (S2') to a flow channel cross-sectional area (A2') in the gas flow channel of the second gas nozzle 70. As a result, similarly to a case in the first embodiment, heat exchange between the first gas heating mechanism body 65b and the second gas heating mechanism body 75b, and the processing gas is stimulated, and thus the processing gas is efficiently heated.

The gas heating mechanism joint 65c and the second gas heating mechanism joint 75c are provided with a gas flow channel constituted by plural holes (through hole) 65d and a gas flow channel constituted by plural holes (through hole) 75d, respectively. The gas flow channel constituted by plural holes 65d and the gas flow channel constituted by plural holes 75d communicate with the inside of the first gas supply pipe 222 (see FIG. 2A) and the inside of the second gas supply pipe 260 (see FIG. 2A), respectively.

The ratio (S3/A3) of a flow channel circumferential length (S3) to a flow channel cross-sectional area (A3) in the gas flow channel (plural holes 65d) of the first gas heating joint 65c is larger than the ratio (S1'/A1') of a flow channel circumferential length (S1') to a flow channel cross-sectional area (A1') in the gas flow channel of the first gas nozzle 60, and the ratio (54/A4) of a flow channel circumferential length (S4) to a flow channel cross-sectional area (A4) in the gas flow channel (plural holes 75d) of the second gas heating joint 75c is larger than the ratio (S2'/A2') of a flow channel circumferential length (S2') to a flow channel cross-sectional area (A2') in the gas flow channel of the second gas nozzle 70. As a result, similarly to the first gas heating mechanism body 65b and the second gas heating mechanism body 75b, heat exchange between the gas heating mechanism joint 65c and the second gas heating mechanism joint 75c, and the processing gas is stimulated, and thus the processing gas is efficiently heated.

Further, the flow channel cross-sectional area (A3) in the gas flow channel (plural holes 65d) of the first gas heating joint 65c and the flow channel cross-sectional area (A4) in the gas flow channel (plural holes 75d) of the second gas heating joint 75c are different from the flow channel cross-sectional area (A1) in the gas flow channel (plural holes 65a) of the first gas heating mechanism body 65b and the flow channel cross-sectional area (A2) in the gas flow channel (plural holes 75a) of the second gas heating mechanism body 75b. Therefore, the number of gas flow channels (plural holes 65d) of the first gas heating joint 65c and the number of gas flow channels (plural holes 75d) of the second gas heating joint 75c are different from the number of gas flow channels (plural holes 65a) of the first gas heating mechanism body 65b and the number of gas flow channels (plural holes 75a) of the second gas heating mechanism body 75b. As a result, the flow of the processing gas from the first gas heating joint 65c is cut off once in a space 65e between the first gas heating joint 65c and the first gas heating mechanism body 65b, and the flow of the processing gas from the second gas heating joint 75c is cut off once in a space 75e between the second gas heating joint 75c and the second gas heating mechanism body 75b. Therefore, the processing gas does not flow smoothly from the gas flow channel (plural holes 65d) of the first gas heating joint 65c into the gas flow channel (plural holes 65a) of the first gas heating mechanism body 65b, and the processing gas does not flow smoothly from the gas flow channel (plural holes 75d) of the second gas heating joint 75c into the gas flow channel (plural holes 75a) of the second gas heating mechanism body 75b. As a result, preheating efficiency in the first gas heating mechanism 65 and the second gas heating mechanism 75 of the present embodiment can be further improved than preheating efficiency in the first gas heating mechanism 65 and the second gas heating mechanism 75 of the first embodiment.

Another Embodiment of the Present Invention

As stated above, although the embodiments of the present invention have been described in detail, the present invention is not limited to the above-mentioned embodiments, but various changes may be made without departing from the scope of the invention.

Figure 8A:
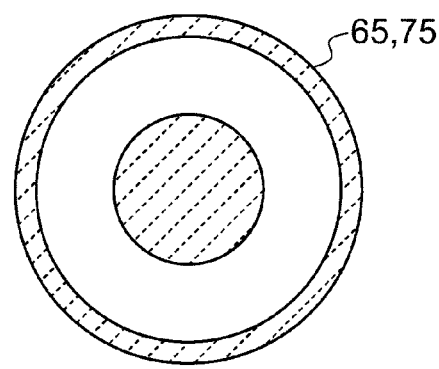
FIG. 8A is a transverse cross-sectional view illustrating a modified example of a gas flow channel included in the gas heating mechanism.
Figure 8B:
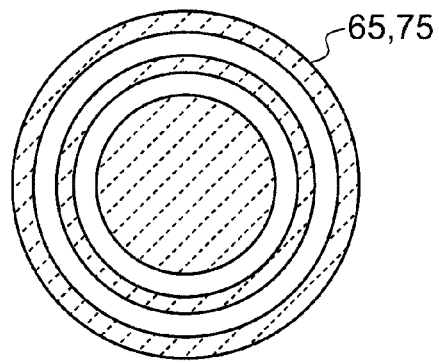
FIG. 8B is a transverse cross-sectional view illustrating a modified example of the gas flow channel included in the gas heating mechanism.
Figure 8C:
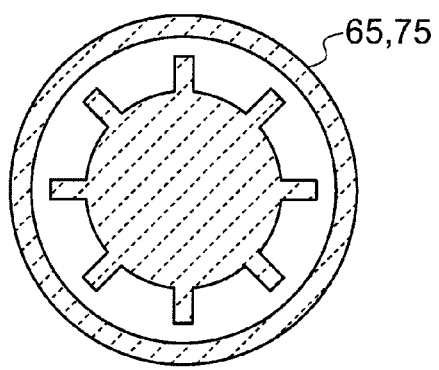
FIG. 8C is a transverse cross-sectional view illustrating a modified example of the gas flow channel included in the gas heating mechanism.
Figure 8D:
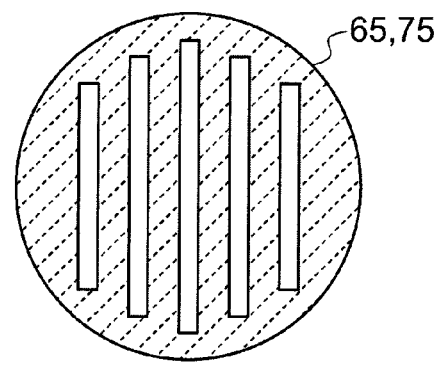
FIG. 8D is a transverse cross-sectional view illustrating a modified example of the gas flow channel included in the gas heating mechanism.
Figure 8E:
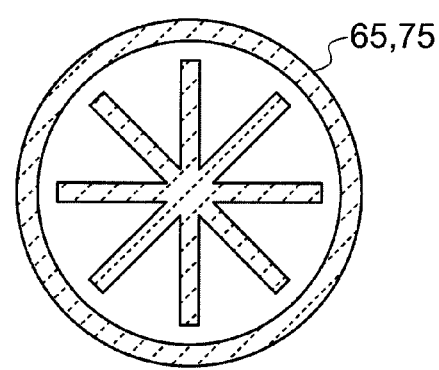
FIG. 8E is a transverse cross-sectional view illustrating a modified example of the gas flow channel included in the gas heating mechanism.

For example, the gas flow channel provided within the first gas heating mechanism 65 and the second gas heating mechanism 75 is not limited to a case where it is constituted by plural holes (through holes) 65a and 75a. That is, when the ratio (S/A) of the flow channel circumferential length (S) to the flow channel cross-sectional area (A) in the gas flow channel provided within the gas heating mechanism is larger than the ratio (S'/A') of the flow channel circumferential length (S') to the flow channel cross-sectional area (A') in the gas flow channel provided within the gas nozzle, arbitrary configurations can be made. For example, a hollow annular gas flow channel may be formed as shown in FIG. 8A, a gas flow channel constituted by plural hollow annular gaps disposed concentrically may be formed as shown in FIG. 8B, a relief structure may be formed at the inner wall (inner circumferential side or outer circumferential side) of the gas flow channel as shown in FIGS. 8C and 8E, and a gas flow channel constituted by plural slit-shaped holes may be formed as shown in FIG. 8D. In addition, the above configurations may be combined arbitrarily.

In addition, the first gas heating mechanism 65 and the first gas nozzle 60 may be formed as a separate member as in the above-mentioned embodiments. Similarly, the second gas heating mechanism 75 and the second gas nozzle 70 may be formed as a separate member. With such a configuration, the first gas heating mechanism 65, the second gas heating mechanism 75, the first gas nozzle 60, and the second gas nozzle 70 are easily manufactured. In addition, as a material, a heat resistant material such as, for example, carbon graphite or SiC which is not likely to be processed can be used.

In addition, the first gas heating mechanism 65 and the first gas nozzle 60 may be formed integrally with each other. Similarly, the second gas heating mechanism 75 and the second gas nozzle 70 may be formed integrally with each other. With such a configuration, attachment and detachment to and from the treatment furnace 40 are facilitated, and thus maintenance can be improved.

In addition, the silane ($SiH_4$) gas is exemplified as a silicon-containing gas, but other silicon-containing gases such as a disilane ($Si_2H_6$) gas and a trisilane ($Si_3H_8$) gas may be used.

In addition, the hydrogen chloride (HCl) gas is exemplified as a chlorine-containing gas, but other chlorine-containing gases such as, for example, a chlorine ($Cl_2$) gas may be used.

In addition, when a silicon-containing gas and a chlorine-containing gas are caused to flow, a gas including both a silicon (Si) atom and a chlorine (Cl) atom, for example, a tetrachlorosilane ($SiCl_4$) gas, a trichlorosilane ($SiHCl_3$) gas, a dichlorosilane ($SiH_2Cl_2$) gas or the like may be supplied as the silicon-containing gas. The gas including a Si atom and a Cl atom is not only a silicon-containing gas, but also a mixed gas of a silicon-containing gas and a chlorine-containing gas. Particularly, the temperature at which $SiCl_4$ is thermally decomposed is relatively high, and thus $SiCl_4$ can be preferably used from the viewpoint of suppressing Si deposition within the first gas nozzle 60.

In addition, the $C_3H_8$ gas is exemplified as a carbon-containing gas, but other carbon-containing gases such as an ethylene ($C_2H_4$) gas and an acetylene ($C_2H_2$) gas may be used.

In addition, the $H_2$ gas is exemplified as a reducing gas, but other hydrogen-containing gases may be used without being limited thereto. Further, as a carrier gas, at least one of rare gases such as an argon (Ar) gas, a helium (He) gas, a neon (Ne) gas, a krypton (Kr) gas, and a xenon (Xe) gas may be used, and a mixed gas obtained by combining the above-mentioned gases may be used.

In addition, in the above-mentioned embodiment, description has been made of a case where the present invention is applied to a SiC epitaxial growth system in which the processing gas is preferably heated in advance, but the present invention is not limited to such a configuration. That is, as long as a process of heating the processing gas is used, such as process can be preferably applied to substrate processing apparatus in which other processes such as film formation etching, oxidation, and nitration are performed, a method for manufacturing a substrate, and a method for manufacturing a semiconductor device.

Example

Hereinafter, an example of the present invention will be described with reference to the accompanying drawings.

In an example, the temperature distributions of the inside of the processing chamber and each wafer 14 were calculated when the processing gas preheated by the gas heating mechanisms 65 and 75 is supplied to plural wafers 14 from the gas nozzles 60 and 70, using the substrate processing apparatus configured similarly to the above-mentioned first embodiment. In addition, in a comparative example, the same temperature distributions when the gas heating mechanisms 65 and 75 are not used were calculated. Meanwhile, the temperature (wafer temperature) of the inside of the processing chamber before the processing gas is supplied was set to 1600° C.

Figure 13:
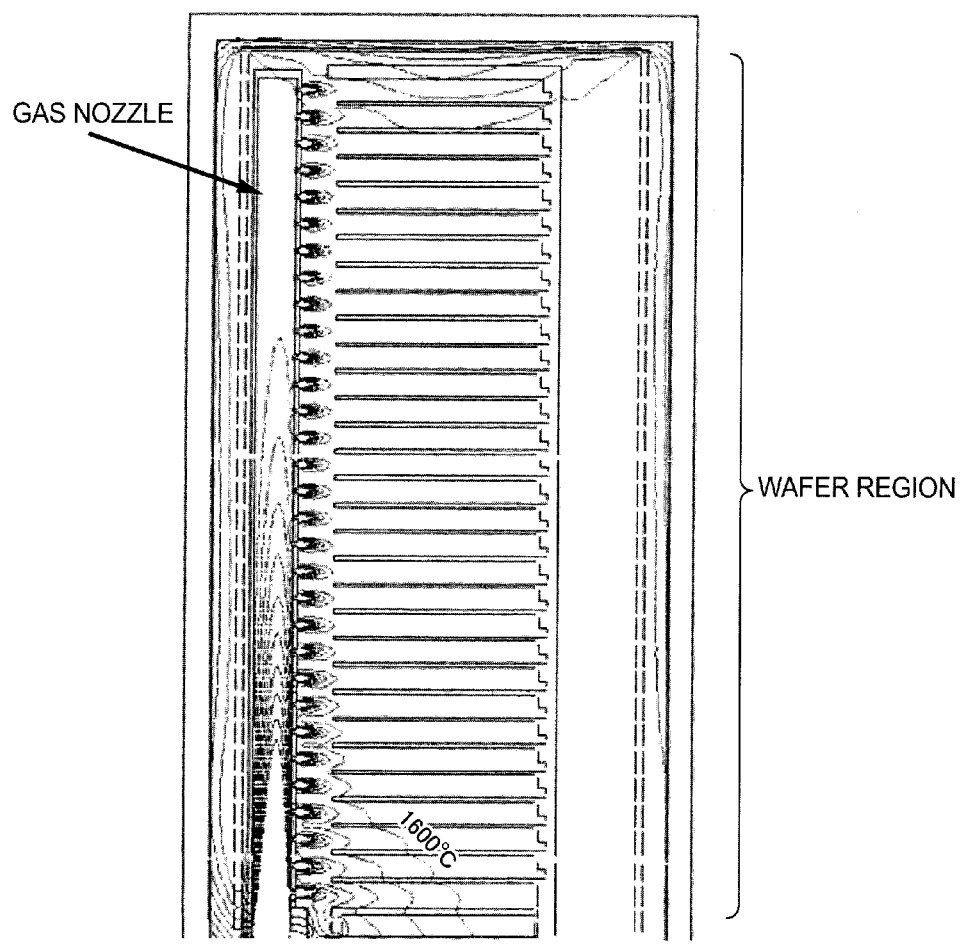
FIG. 13 is a diagram illustrating calculation results of the temperature distributions of the inside of a processing chamber and each wafer according to an example of the present invention.
Figure 14:
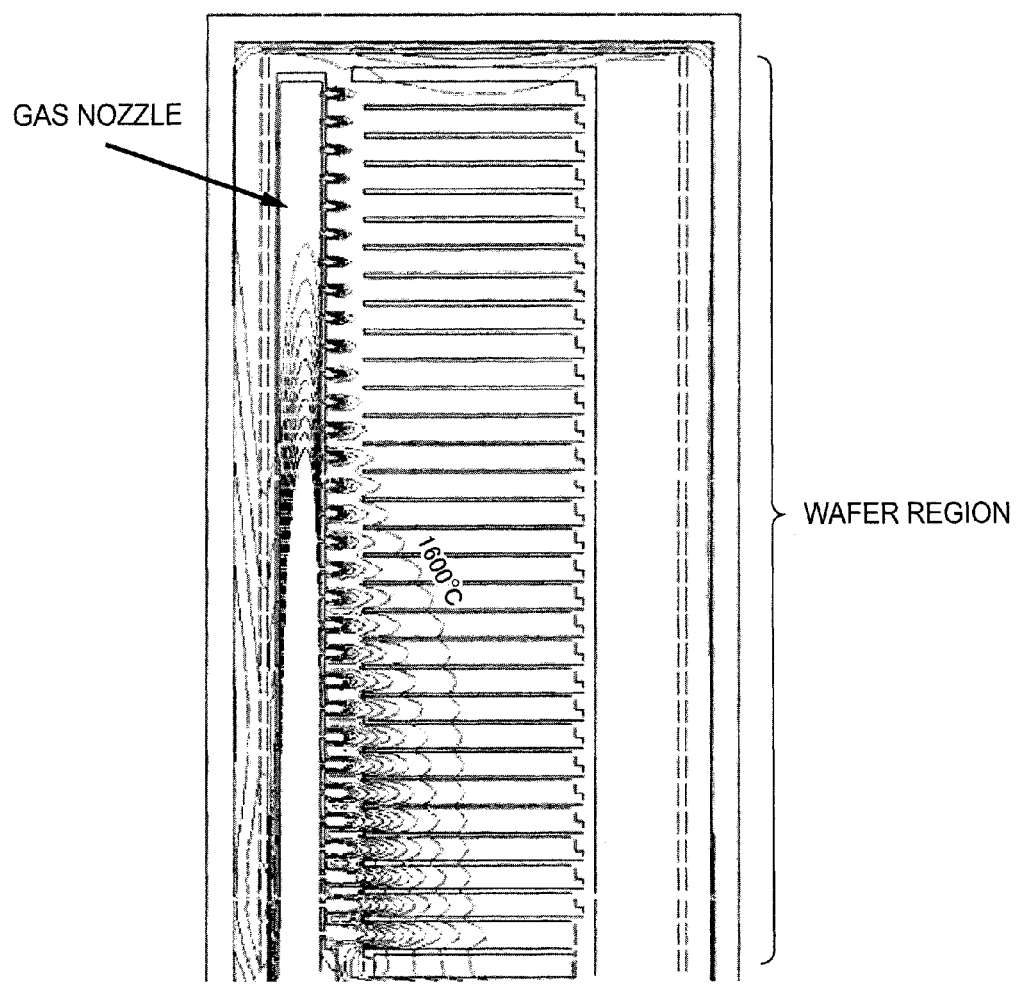
FIG. 14 is a diagram illustrating calculation results of the temperature distributions of the inside of the inside of the processing chamber and each wafer according to a comparative example.
Figure 15:
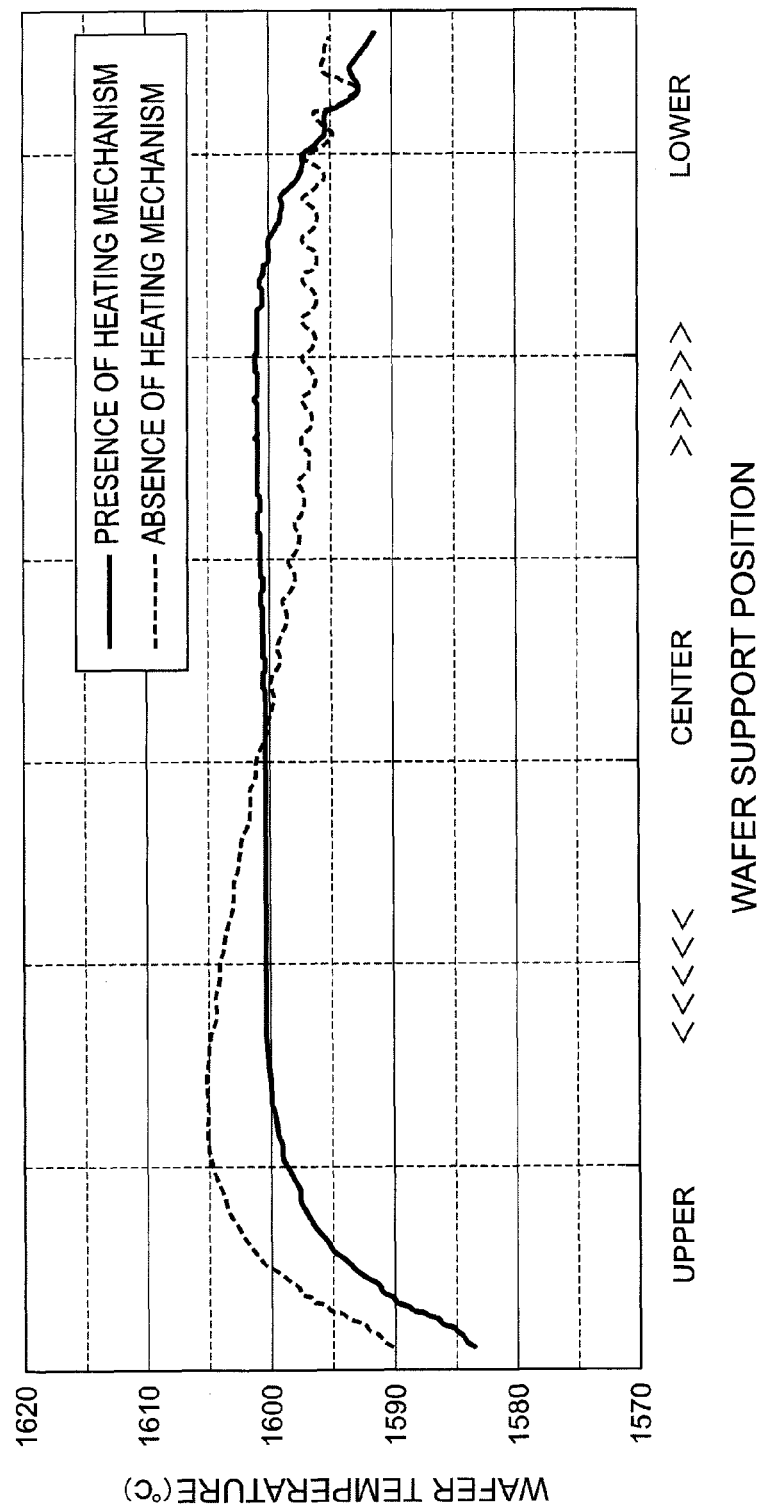
FIG. 15 is a graphical diagram illustrating calculation results of the temperature distribution between the wafers according to the example of the present invention and the comparative example.

FIG. 13 is a diagram illustrating calculation results of the temperature distributions of the inside of the processing chamber and each wafer according to the example, and FIG. 14 is a diagram illustrating the temperature distributions of the inside of the processing chamber and each wafer according to the comparative example. FIG. 15 is a graphical diagram illustrating calculation results of the temperature distributions between the wafers according to the example and the comparative example. The horizontal axis of FIG. 15 represents the support position (height) of the wafer, and the vertical axis thereof represents the temperature of the wafer.

As shown in FIG. 13 and "presence of heating mechanism" of FIG. 15, when the gas heating mechanism is used (Example), it is known that a drop in the temperatures of the inside of the processing chamber and the wafer can be suppressed, and temperature uniformity can be improved. It is considered that this is because the processing gas supplied to the wafer can be sufficiently heated by the gas heating mechanism. In addition, as shown in FIG. 14 and "absence of heating mechanism" of FIG. 15, when the gas heating mechanism is not used (Comparative Example), it is known that the temperatures of the inside of the processing chamber and the wafer drop locally, and temperature uniformity deteriorates. It is considered that this is because the processing gas is insufficiently heated within the gas nozzle, and the processing gas is supplied into the processing chamber in a state where the temperature is low. Particularly, it is known that there is a tendency for lack of a heating time (short residence time within the gas nozzle) in the upstream side (lower half of the wafer region) of the gas nozzle, and a drop in temperature is remarkable.

<Preferred Form of the Present Invention>

Hereinafter, preferred forms of the present invention are added.

According to an aspect of the present invention, there is provided a substrate processing apparatus including:

a processing chamber that accommodates a substrate;

a heating portion that is provided so as to surround a accommodating region of the substrate within the processing chamber;

a gas nozzle that is provided inside the heating portion and that supplies a processing gas to the accommodating region of the substrate; and a gas heating mechanism that is provided inside the heating portion and that supplies the processing gas from an upstream side of the gas nozzle into the gas nozzle, wherein a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle.

Preferably, the gas flow channel of the gas heating mechanism includes plural holes.

Preferably, the plural holes are disposed in a zigzag shape.

Preferably, an outside diameter of the gas heating mechanism is larger than an outside diameter of the gas nozzle.

Preferably, a diametrical outside diameter of the processing chamber in the gas heating mechanism is larger than a diametrical outside diameter of the processing chamber in the gas nozzle.

Preferably, a lower end of the heating portion is formed to be lower than an upper end of the gas heating mechanism.

Preferably, the processing gas supplied from the gas nozzle to the accommodating region of the substrate is exhausted through a region provided with the gas heating mechanism.

Preferably, the gas heating mechanism is provided at a downstream side of an exhaust gas so as to narrow an exhaust gas flow channel.

Preferably, the gas heating mechanism is provided at a downstream side of the processing gas in the accommodating region of the substrate so as to narrow a flow channel of the processing gas.

Preferably, the substrate processing apparatus further includes:

a substrate holding body that is accommodated within the processing chamber and that holds plural substrates in a vertical direction so as to form a gap therebetween; and a cylindrical thermal insulating portion that supports the substrate holding body from below within the processing chamber, wherein the gas heating mechanism is provided so as to form a gap between the thermal insulating portion and the gas heating mechanism, and the processing gas that is exhausted from the inside of the processing chamber is exhausted through the gap.

Preferably, a center line of the gas nozzle is disposed at a position further away from the substrate than a center line of the gas heating mechanism.

Preferably, the gas nozzle and the gas heating mechanism are formed as a separate member.

Preferably, the gas nozzle and the gas heating mechanism are formed integrally with each other.

Preferably, the substrate processing apparatus further includes a second gas heating mechanism including a gas flow channel having plural holes at a gas supply upstream side of the gas heating mechanism.

Preferably, a flow channel cross-sectional area of the gas flow channel of the second gas heating mechanism is different from a flow channel cross-sectional area of the gas flow channel of the gas heating mechanism.

Preferably, a number of plural holes of the gas flow channel of the second gas heating mechanism is different from a number of plural holes of the gas flow channel of the gas heating mechanism.

According to another aspect of the present invention, there is provided a method for manufacturing a substrate, including:

a step of accommodating a substrate within a processing chamber;

a step of starting heating by a heating portion provided so as to surround a accommodating region of the substrate within the processing chamber, and raising a temperature of the substrate to a predetermined temperature;

a step of supplying heated processing gas from a gas heating mechanism through a gas nozzle into the processing chamber and processing the substrate, the gas heating mechanism being provided inside the heating portion and supplying a processing gas from an upstream side of the gas nozzle that supplies the processing gas to the accommodating region of the substrate into the gas nozzle, and being configured such that a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle; and a step of unloading the substrate after the processing from the inside of the processing chamber.

According to still another aspect of the present invention, there is provided a method for manufacturing a semiconductor device, including:

a step of accommodating a substrate within a processing chamber;

a step of starting heating by a heating portion provided so as to surround a accommodating region of the substrate within the processing chamber, and raising a temperature of the substrate to a predetermined temperature;

a step of supplying heated processing gas from a gas heating mechanism through a gas nozzle into the processing chamber and processing the substrate, the gas heating mechanism being provided inside the heating portion and supplying a processing gas from an upstream side of the gas nozzle that supplies the processing gas to the accommodating region of the substrate into the gas nozzle, and being configured such that a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle; and a step of unloading the substrate after the processing from the inside of the processing chamber.

The disclosure of Japanese Patent Application No. 2011-038813 is incorporated herein by reference in its entirety, as long as the national laws and regulations in designated states designated by this international application or elected states permit.

All publications, patent applications, and technical standards mentioned in this specification are herein incorporated by reference to the same extent as each individual publication, patent application, or technical standard is specifically and individually indicated to be incorporated by reference, as long as the national laws and regulations in designated states designated by this international application or elected states permit.

A variety of typical embodiments have been illustrated and described, but the present invention is not limited to these embodiments. Therefore, the scope of the present invention is intended to be limited only to the following claims.

The invention claimed is:

1. A substrate processing apparatus comprising:
   a processing chamber that accommodates a substrate;
   a heating portion that is provided so as to surround an accommodating region of the substrate within the processing chamber;
   a gas nozzle that is provided inside the heating portion and that supplies a processing gas to the accommodating region of the substrate; and
   a gas heating mechanism that is provided inside the heating portion and that supplies the processing gas from an upstream side of the gas nozzle into the gas nozzle, wherein
   a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle, and wherein
   the gas flow channel of the gas heating mechanism includes plural holes.

2. A substrate processing apparatus according to claim 1, wherein the plural holes are disposed in a zigzag shape.

3. A substrate processing apparatus according to claim 1, wherein the gas heating mechanism is provided at a downstream side of an exhaust gas so as to narrow an exhaust gas flow channel.

4. A substrate processing apparatus according to claim 1, further comprising:
   a second gas heating mechanism including a gas flow channel having plural holes at a gas supply upstream side of the gas heating mechanism.

5. A substrate processing apparatus according to claim 4, wherein a flow channel cross-sectional area of the gas flow channel of the second gas heating mechanism is different from a flow channel cross-sectional area of the gas flow channel of the gas heating mechanism.

6. A substrate processing apparatus according to claim 4, wherein a number of plural holes of the gas flow channel of the second gas heating mechanism is different from a number of plural holes of the gas flow channel of the gas heating mechanism.

7. A substrate processing apparatus according to claim 1, wherein an outside diameter of the gas heating mechanism is larger than an outside diameter of the gas nozzle.

8. A substrate processing apparatus according to claim 1, wherein a lower end of the heating portion is formed to be lower than an upper end of the gas heating mechanism.

9. A substrate processing apparatus according to claim 1, wherein the processing gas supplied from the gas nozzle to the accommodating region of the substrate is exhausted through a region provided with the gas heating mechanism.

10. A substrate processing apparatus according to claim 1, wherein the gas heating mechanism is provided at a downstream side of the processing gas in the accommodating region of the substrate so as to narrow a flow channel of the processing gas.

11. A substrate processing apparatus according to claim 1, further comprising:
   a substrate holding body that is accommodated within the processing chamber and that holds plural substrates in a vertical direction so as to form a gap therebetween; and
   a cylindrical thermal insulating portion that supports the substrate holding body from below within the processing chamber, wherein
   the gas heating mechanism is provided so as to form a gap between the thermal insulating portion and the gas heating mechanism, and the processing gas that is exhausted from the inside of the processing chamber is exhausted through the gap.

12. A substrate processing apparatus according to claim 1, wherein a center line of the gas nozzle is disposed at a position further away from the substrate than a center line of the gas heating mechanism.

13. A substrate processing apparatus according to claim 1, wherein the gas nozzle and the gas heating mechanism are formed as a separate member.

14. A substrate processing apparatus according to claim 1, wherein the gas nozzle and the gas heating mechanism are formed integrally with each other.

15. A method for manufacturing a substrate, comprising:
   accommodating a substrate within a processing chamber;
   starting heating by a heating portion provided so as to surround an accommodating region of the substrate within the processing chamber, and raising a temperature of the substrate to a predetermined temperature;
   supplying heated processing gas from a gas heating mechanism through a gas nozzle into the processing chamber and processing the substrate, the gas heating mechanism being provided inside the heating portion and supplying a processing gas from an upstream side of the gas nozzle that supplies the processing gas to the accommodating region of the substrate into the gas nozzle, and being configured such that a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle; and
   unloading the substrate after the processing from the inside of the processing chamber; wherein
   the gas flow channel of the gas heating mechanism includes plural holes.

16. A method for manufacturing a semiconductor device, comprising:
   accommodating a substrate within a processing chamber;
   starting heating by a heating portion provided so as to surround an accommodating region of the substrate within the processing chamber, and raising a temperature of the substrate to a predetermined temperature;
   supplying heated processing gas from a gas heating mechanism through a gas nozzle into the processing chamber and processing the substrate, the gas heating mechanism being provided inside the heating portion and supplying a processing gas from an upstream side of the gas nozzle that supplies the processing gas to the accommodating region of the substrate into the gas nozzle, and being configured such that a ratio of a flow channel circumferential length to a flow channel cross-sectional area in a gas flow channel of the gas heating mechanism is larger than a ratio of a flow channel circumferential length to a flow channel cross-sectional area in a gas flow channel of the gas nozzle; and
   unloading the substrate after the processing from the inside of the processing chamber; wherein
   the gas flow channel of the gas heating mechanism includes plural holes.

* * * * *